US008884263B2

(12) United States Patent
Oh et al.

(10) Patent No.: US 8,884,263 B2
(45) Date of Patent: Nov. 11, 2014

(54) NON-VOLATILE MEMORY DEVICE HAVING CONDUCTIVE BUFFER PATTERN AND METHOD OF FABRICATING THE SAME

(75) Inventors: Gyu-Hwan Oh, Hwaseong-si (KR); Doo-Hwan Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 161 days.

(21) Appl. No.: 13/517,755

(22) Filed: Jun. 14, 2012

(65) Prior Publication Data

US 2013/0099190 A1    Apr. 25, 2013

(30) Foreign Application Priority Data

Oct. 20, 2011    (KR) .................... 10-2011-0107749

(51) Int. Cl.
*H01L 47/00* (2006.01)
*H01L 27/24* (2006.01)
*H01L 45/00* (2006.01)
*H01L 29/06* (2006.01)
*H01L 27/102* (2006.01)

(52) U.S. Cl.
CPC ............ *H01L 27/2463* (2013.01); *H01L 45/06* (2013.01); *H01L 45/143* (2013.01); *H01L 29/0676* (2013.01); *H01L 45/1253* (2013.01); *H01L 45/1233* (2013.01); *H01L 45/144* (2013.01); *H01L 27/2409* (2013.01); *H01L 27/1021* (2013.01); *H01L 45/1683* (2013.01); *H01L 45/141* (2013.01)
USPC .............................................. 257/4

(58) Field of Classification Search
CPC .................................................. H01L 45/00
USPC .............................................. 257/4
See application file for complete search history.

(56) References Cited

U.S. PATENT DOCUMENTS

| | | | | | |
|---|---|---|---|---|---|
| 5,687,112 | A | * | 11/1997 | Ovshinsky | 365/163 |
| 6,429,064 | B1 | * | 8/2002 | Wicker | 438/238 |
| 6,631,085 | B2 | * | 10/2003 | Kleveland et al. | 365/175 |
| 6,661,691 | B2 | * | 12/2003 | Fricke et al. | 365/63 |
| 7,038,230 | B2 | * | 5/2006 | Chen et al. | 257/3 |
| 7,220,983 | B2 | * | 5/2007 | Lung | 257/4 |
| 7,279,380 | B2 | * | 10/2007 | Lung | 438/244 |
| 7,482,621 | B2 | * | 1/2009 | Yang et al. | 257/40 |
| 7,511,297 | B2 | * | 3/2009 | Jang et al. | 257/42 |
| 7,569,845 | B2 | * | 8/2009 | Chen et al. | 257/3 |
| 7,651,906 | B2 | * | 1/2010 | Park et al. | 438/237 |
| 7,824,954 | B2 | * | 11/2010 | An et al. | 438/102 |
| 7,923,305 | B1 | * | 4/2011 | Nguyen et al. | 438/128 |
| 7,923,810 | B2 | * | 4/2011 | Ha et al. | 257/511 |
| 8,021,918 | B2 | * | 9/2011 | Lin et al. | 438/106 |

(Continued)

FOREIGN PATENT DOCUMENTS

| | | |
|---|---|---|
| KR | 10-0764056 | 10/2007 |
| KR | 10-2009-0010427 | 1/2009 |

(Continued)

*Primary Examiner* — Caleb Henry
(74) *Attorney, Agent, or Firm* — Onello & Mello, LLP

(57) ABSTRACT

A diode may be formed within a molding layer on a substrate. A conductive buffer pattern having a greater planar area than the diode may be on the diode and molding layer. An electrode structure may be on the conductive buffer pattern. A data storage pattern may be on the electrode structure. One lateral surface of the conductive buffer pattern may be vertically aligned with one lateral surface of the electrode structure.

9 Claims, 35 Drawing Sheets

(56) References Cited

U.S. PATENT DOCUMENTS

| | | | |
|---|---|---|---|
| 8,129,705 B2 * | 3/2012 | Kinoshita et al. | 257/2 |
| 8,468,692 B2 * | 6/2013 | Kim | 29/846 |
| 8,507,353 B2 * | 8/2013 | Oh et al. | 438/382 |
| 8,551,850 B2 * | 10/2013 | Li et al. | 438/381 |
| 8,551,855 B2 * | 10/2013 | Xu et al. | 438/385 |
| 8,558,348 B2 * | 10/2013 | Oh et al. | 257/536 |
| 2004/0087074 A1 * | 5/2004 | Hwang et al. | 438/198 |
| 2005/0067648 A1 * | 3/2005 | Hung et al. | 257/301 |
| 2005/0242386 A1 * | 11/2005 | Ang | 257/306 |
| 2006/0011902 A1 * | 1/2006 | Song et al. | 257/4 |
| 2006/0284237 A1 * | 12/2006 | Park et al. | 257/314 |
| 2007/0069402 A1 * | 3/2007 | Johnson | 257/E29.17 |
| 2007/0086235 A1 * | 4/2007 | Kim et al. | 365/163 |
| 2007/0111487 A1 * | 5/2007 | Kim et al. | 438/478 |
| 2007/0230237 A1 * | 10/2007 | Schwerin et al. | 365/163 |
| 2007/0285969 A1 * | 12/2007 | Toda et al. | 365/148 |
| 2007/0290186 A1 * | 12/2007 | Bourim et al. | 257/4 |
| 2008/0003815 A1 * | 1/2008 | Lee et al. | 438/653 |
| 2008/0006907 A1 * | 1/2008 | Lee et al. | 257/613 |
| 2008/0048293 A1 * | 2/2008 | Horii | 257/536 |
| 2008/0073755 A1 * | 3/2008 | Ang et al. | 257/656 |
| 2008/0099753 A1 * | 5/2008 | Song et al. | 257/2 |
| 2008/0111121 A1 * | 5/2008 | Jang et al. | 257/4 |
| 2008/0113469 A1 * | 5/2008 | Eun et al. | 438/102 |
| 2008/0191188 A1 * | 8/2008 | Jeong | 257/4 |
| 2008/0316795 A1 * | 12/2008 | Herner et al. | 365/148 |
| 2009/0003036 A1 * | 1/2009 | Kumar et al. | 365/148 |
| 2009/0008623 A1 * | 1/2009 | Lim et al. | 257/4 |
| 2009/0102012 A1 * | 4/2009 | Ha et al. | 257/511 |
| 2009/0155962 A1 * | 6/2009 | Petti et al. | 438/129 |
| 2009/0168486 A1 * | 7/2009 | Kumar | 365/100 |
| 2009/0256129 A1 * | 10/2009 | Scheuerlein | 257/4 |
| 2009/0261312 A1 * | 10/2009 | Gruening-von Schwerin | 257/2 |
| 2009/0269932 A1 * | 10/2009 | Chen et al. | 438/703 |
| 2010/0038623 A1 * | 2/2010 | Xu et al. | 257/4 |
| 2010/0093130 A1 * | 4/2010 | Oh et al. | 438/102 |
| 2010/0117046 A1 * | 5/2010 | Chang et al. | 257/3 |
| 2010/0142261 A1 * | 6/2010 | Kubo et al. | 365/163 |
| 2010/0144138 A1 * | 6/2010 | Park et al. | 438/637 |
| 2010/0148142 A1 * | 6/2010 | Chien et al. | 257/4 |
| 2010/0227438 A1 * | 9/2010 | Ha | 438/129 |
| 2010/0238704 A1 * | 9/2010 | Komura et al. | 365/148 |
| 2010/0252795 A1 * | 10/2010 | Song et al. | 257/2 |
| 2010/0290262 A1 * | 11/2010 | Scheuerlein et al. | 365/51 |
| 2010/0327251 A1 * | 12/2010 | Park | 257/2 |
| 2011/0014779 A1 * | 1/2011 | Makala et al. | 438/478 |
| 2011/0020998 A1 * | 1/2011 | Oh et al. | 438/381 |
| 2011/0044098 A1 * | 2/2011 | An et al. | 365/163 |
| 2011/0140828 A1 * | 6/2011 | Mikawa et al. | 338/20 |
| 2011/0193048 A1 * | 8/2011 | Oh et al. | 257/4 |
| 2012/0044747 A1 * | 2/2012 | Chung | 365/148 |
| 2012/0119181 A1 * | 5/2012 | Oh et al. | 257/4 |
| 2012/0132879 A1 * | 5/2012 | Kinoshita et al. | 257/1 |
| 2012/0231603 A1 * | 9/2012 | Im et al. | 438/382 |
| 2012/0322223 A1 * | 12/2012 | Oh et al. | 438/382 |
| 2013/0009125 A1 * | 1/2013 | Park et al. | 257/4 |
| 2013/0044532 A1 * | 2/2013 | Bethune et al. | 365/148 |
| 2013/0094278 A1 * | 4/2013 | Hou et al. | 365/148 |
| 2013/0181181 A1 * | 7/2013 | Sekar et al. | 257/2 |
| 2013/0187114 A1 * | 7/2013 | Kai et al. | 257/3 |
| 2013/0313503 A1 * | 11/2013 | Xu et al. | 257/2 |

FOREIGN PATENT DOCUMENTS

| | | |
|---|---|---|
| KR | 10-0876767 | 1/2009 |
| KR | 10-2010-0041139 | 4/2010 |
| WO | 03-073511 | 9/2003 |

* cited by examiner

NON-VOLATILE MEMORY DEVICE HAVING CONDUCTIVE BUFFER PATTERN AND METHOD OF FABRICATING THE SAME

CROSS-REFERENCE TO RELATED APPLICATION

This application claims priority under 35 U.S.C. §119 to Korean Patent Application No. 10-2011-0107749 filed on Oct. 20, 2011, the disclosure of which is hereby incorporated by reference in its entirety.

BACKGROUND

1. Field

Embodiments of the inventive concept relate to a non-volatile memory device and a method of fabricating the same.

2. Description of Related Art

Proper operation of a memory device, such as a phase change random access memory device (PRAM) may depend upon a good ohmic contact between a switching device and an electrode of the memory device. A memory device including such a contact and method for forming it would be highly desirable.

SUMMARY

In exemplary embodiments in accordance with principles of inventive concepts, a non-volatile memory device may include an ohmic contact between a switching device and a lower electrode.

In accordance with exemplary embodiments in accordance with principles of inventive concepts, a non-volatile memory device is provided that includes a diode on a substrate. A conductive buffer pattern is on the diode, having a greater planar surface than the diode. An electrode structure is on the conductive buffer pattern. A data storage pattern is on the electrode structure. One lateral surface of the conductive buffer pattern is vertically aligned with one lateral surface of the electrode structure.

In exemplary embodiments in accordance with principles of inventive concepts, the diode may have a cylindrical shape, and the conductive buffer pattern may have a hexahedral shape.

In exemplary embodiments in accordance with principles of inventive concepts, a molding layer may be on the substrate and a diode may be formed within a contact hole configured to penetrate the molding layer, and the conductive buffer pattern may be on the molding layer. A bottom end of the conductive buffer pattern may extend into the contact hole.

In exemplary embodiments in accordance with principles of inventive concepts, the electrode structure may include a lower electrode, a first spacer on a first lateral surface of the lower electrode, and a second spacer on a second lateral surface of the lower electrode facing the first lateral surface of the lower electrode. The lower electrode may include an upper part having a vertical height greater than a horizontal width, and a lower part having a horizontal width greater than a vertical height. The first lateral surface of the lower electrode may include a first lateral surface of the upper part and a first lateral surface of the lower part. An inner lateral surface of the first spacer may contact the first lateral surface of the lower part and the first lateral surface of the upper part, and an inner lateral surface of the second spacer may contact a top surface of the lower part and a second lateral surface of the upper part facing the first lateral surface of the upper part.

In exemplary embodiments in accordance with principles of inventive concepts, the first lateral surface of the conductive buffer pattern may be vertically aligned with an outer lateral surface of the second spacer and a second lateral surface of the lower part facing the first lateral surface of the lower part. A second lateral surface of the conductive buffer pattern facing the first lateral surface of the conductive buffer pattern may be vertically aligned with an outer lateral surface of the first spacer.

In exemplary embodiments in accordance with principles of inventive concepts, the data storage pattern may be interposed between the first spacer and the second spacer. Lateral surfaces of the data storage pattern may be vertically aligned with the first and second lateral surfaces of the upper part of the lower electrode.

In exemplary embodiments in accordance with principles of inventive concepts, the metal silicide pattern may be interposed between the diode and the conductive buffer pattern. An upper electrode may be on the data storage pattern.

In exemplary embodiments in accordance with principles of inventive concepts, a non-volatile memory device may include a molding layer on a substrate. A switching device is positioned through the molding layer. A pair of insulating lines are on the molding layer, spaced apart and parallel to one another. A pair of insulating patterns are interposed between the insulating lines on the molding layer and spaced apart from one another. A conductive buffer pattern is interposed between the insulating lines and the insulating patterns and overlaps the switching device. An electrode structure is on the conductive buffer pattern. A data storage pattern is on the electrode structure. One lateral surface of the conductive buffer pattern is vertically aligned with one lateral surface of the electrode structure.

In exemplary embodiments in accordance with principles of inventive concepts, bottom ends of the insulating lines and the insulating patterns may be formed lower than a top end of the molding layer. Bottom ends of the insulating lines may be formed at a different level from bottom ends of the insulating patterns.

In exemplary embodiments in accordance with principles of inventive concepts, the top end of the molding layer may extend between the insulating lines and the switching device, and extend between the insulating patterns and the switching device. Top ends of the insulating lines, the insulating patterns, and the electrode structure may be disposed at substantially the same level. The insulating lines and the insulating patterns may be in contact with lateral surfaces of the conductive buffer pattern and lateral surfaces of the electrode structure. Lateral surfaces of the data storage pattern may be in contact with the insulating lines.

In exemplary embodiments in accordance with principles of inventive concepts, a non-volatile memory device comprises: a vertical diode in a contact hole within a molding layer atop a first memory access line; a buffer layer over the diode and molding layer; a bottom electrode over the buffer layer; a data storage pattern in contact with the bottom electrode on a bottom side and with a top electrode on a top side; and a second memory access line in contact with the top electrode.

In exemplary embodiments in accordance with principles of inventive concepts, the buffer layer includes a plurality of layers.

In exemplary embodiments in accordance with principles of inventive concepts, the buffer layer has a surface area larger than the surface area of the top surface of the diode.

In exemplary embodiments in accordance with principles of inventive concepts, the data storage pattern includes phase change memory material.

In exemplary embodiments in accordance with principles of inventive concepts, the phase change memory material is a chalcongenide material.

In exemplary embodiments in accordance with principles of inventive concepts, a non-volatile memory device may be formed by forming a diode in a contact hole within a molding layer atop a first memory access line, such as a word line; forming a buffer layer over the diode and molding layer; forming a bottom electrode over the buffer layer; forming a data storage pattern in contact with the bottom electrode on a bottom side and with a top electrode on a top side; and forming a second memory access line, such as a bit line, in contact with the top electrode. In exemplary embodiments in accordance with principles of inventive concepts, the buffer layer and top electrode structure may be patterned in the same process and the buffer layer may include a plurality of layers, for example.

In exemplary embodiments in accordance with principles of inventive concepts, the buffer layer may be patterned to have a surface area larger than the surface area of the top surface of the diode.

In exemplary embodiments in accordance with principles of inventive concepts, the data storage pattern may include phase change memory material.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DESCRIPTION

Figure 1:
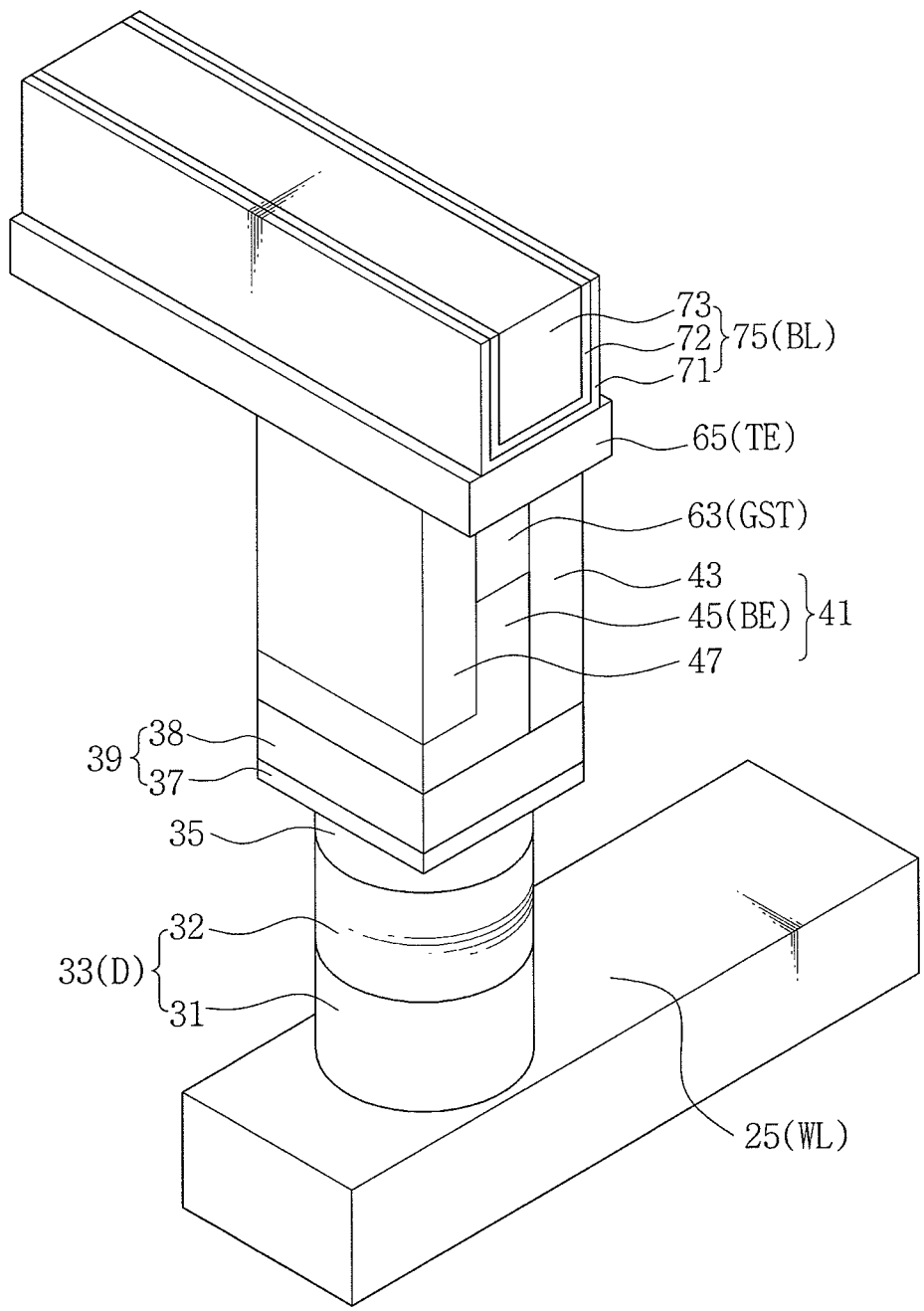
FIG. 1 is a perspective view of main components of a non-volatile memory device according to first embodiments of the inventive concept.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices and methods of fabricating the same according to exemplary embodiments in accordance with principles of inventive concepts will now be described more fully with reference to the accompanying drawings.

Embodiment 1

Figure 2:
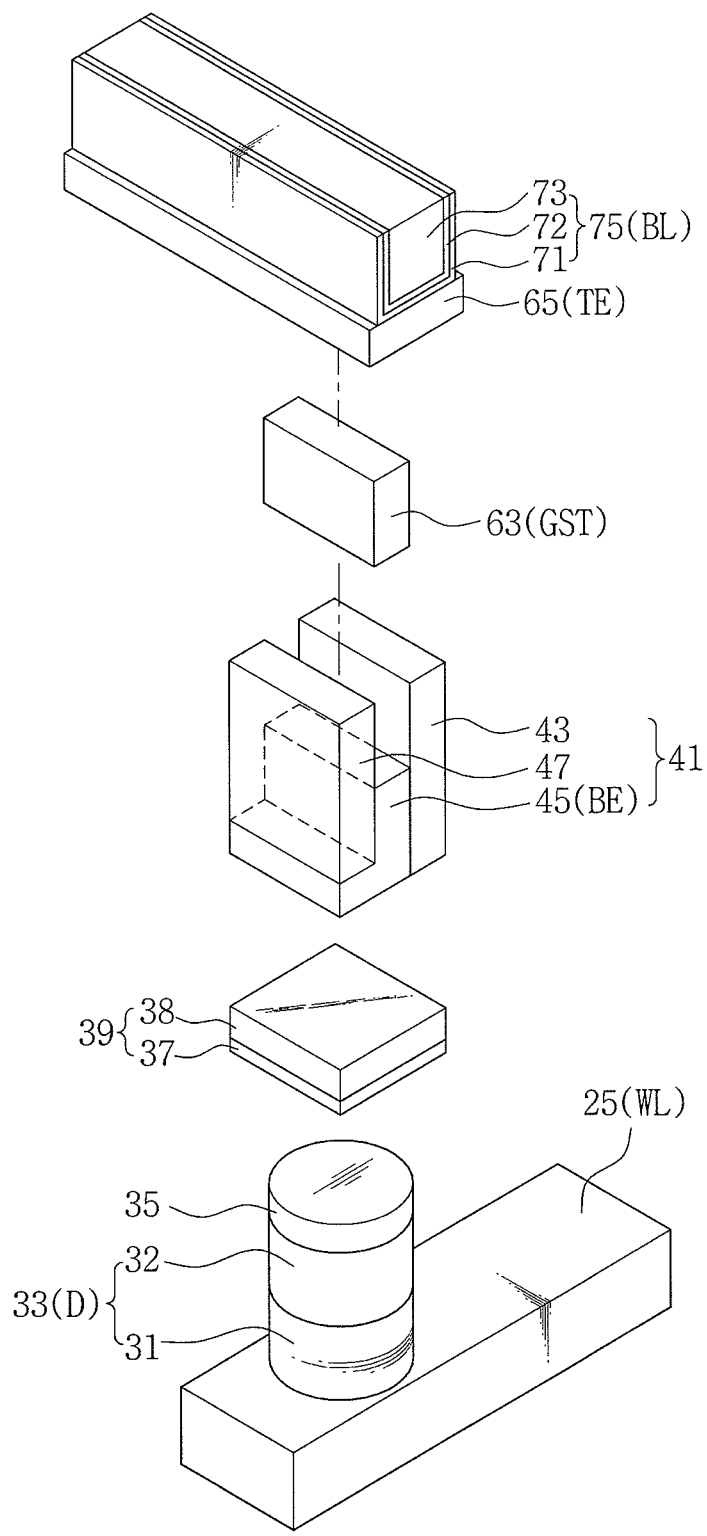
FIG. 2 is an exploded perspective view of the non-volatile memory device of FIG. 1, provided for clarity.
Figure 3:
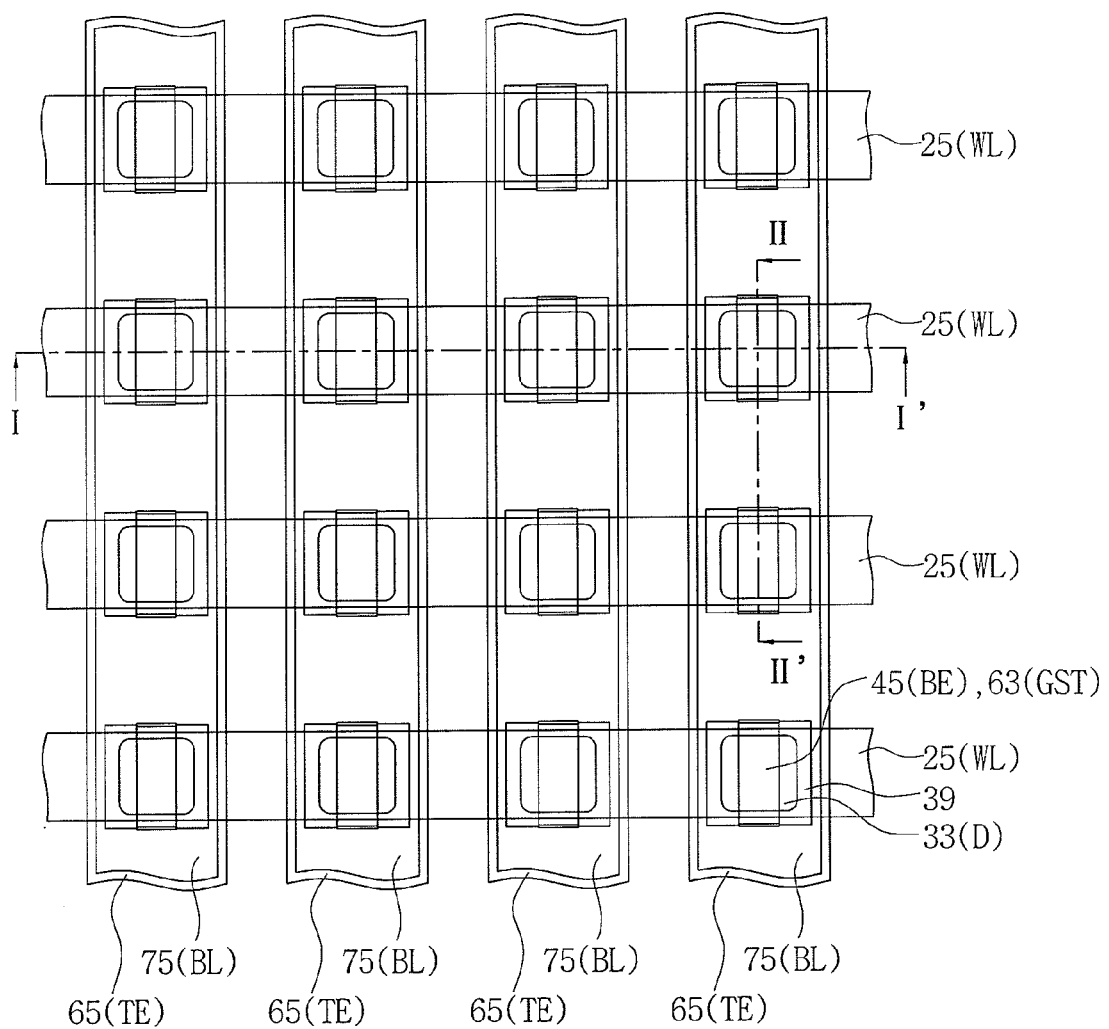
FIG. 3 is a layout illustrating the non-volatile memory device according to first embodiments of the inventive concept.
Figure 4:
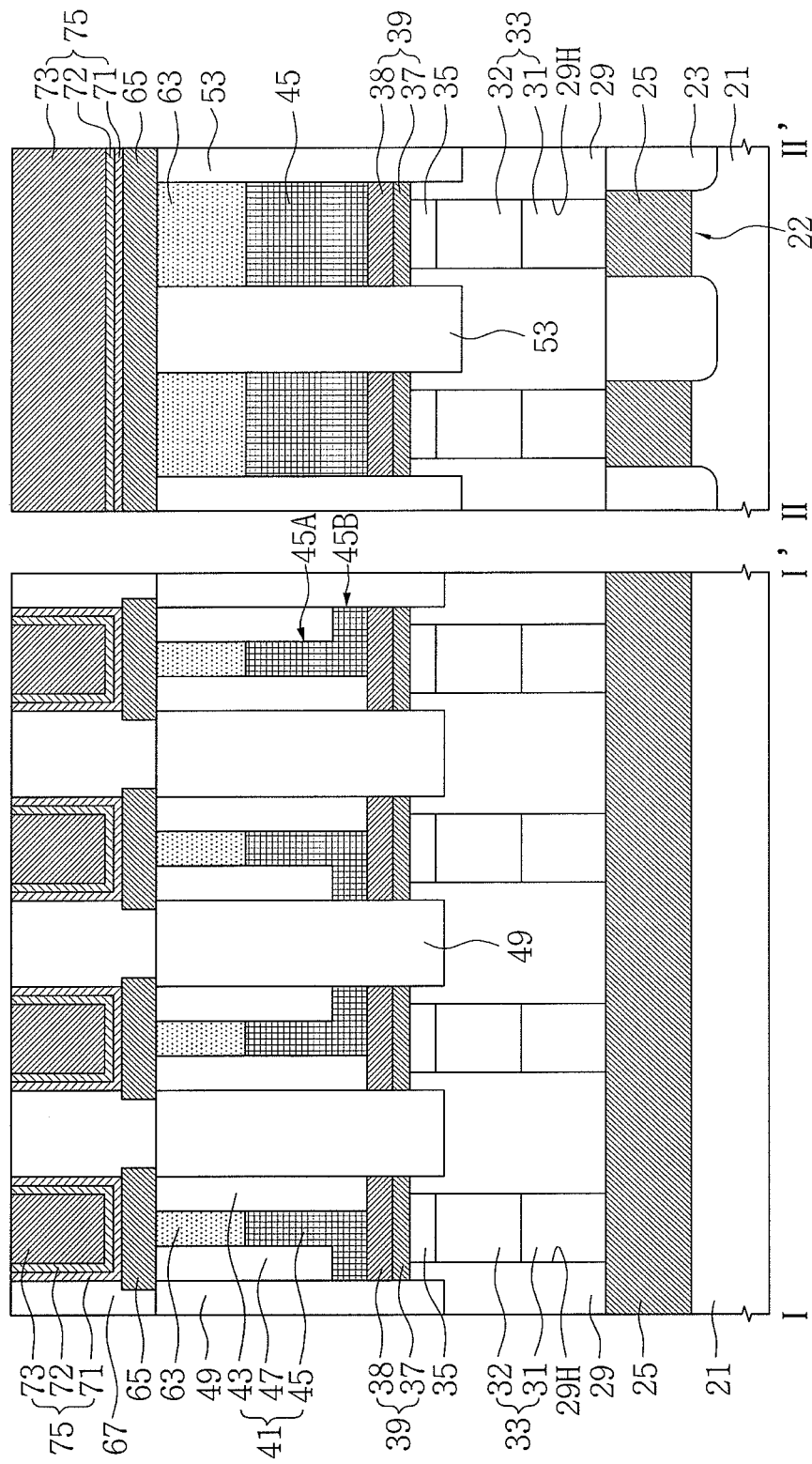
FIGS. 4 and 5 are cross-sectional views taken along lines I-I' and II-II' of FIG. 3.
Figure 5:
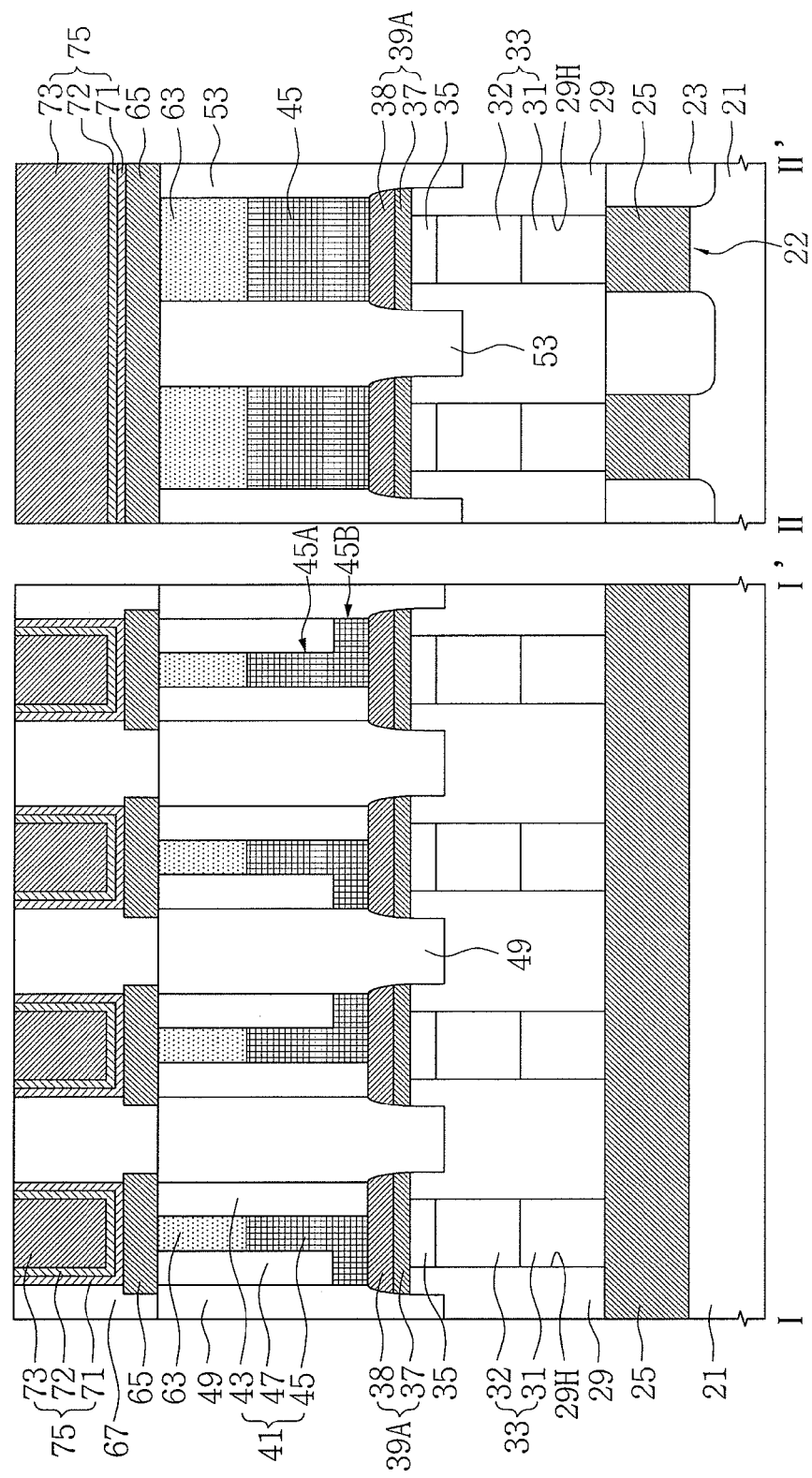

FIG. 1 is a perspective view of components of a non-volatile memory device in accordance with a first exemplary embodiment in accordance with principles of inventive concepts, FIG. 2 is an exploded perspective view of the non-volatile memory device of FIG. 1, provided for clarity, FIG. 3 is a layout illustrating the non-volatile memory device according to a first exemplary embodiment in accordance with principles of inventive concepts, and FIGS. 4 and 5 are cross-sectional views taken along lines I-I' and II-II' of FIG. 3.

Referring to FIGS. 1 and 2, diode 33 may be formed on a word line 25. Diode 33 may include first semiconductor pattern 31 and second semiconductor pattern 32 stacked sequentially. A metal silicide pattern 35 may be formed on the diode 33. A conductive buffer pattern 39 may be formed on the metal silicide pattern 35. The conductive buffer pattern 39 may include a first conductive pattern 37 and a second conductive pattern 38 stacked sequentially. An electrode structure 41 may be formed on the conductive buffer pattern 39. The electrode structure 41 may include a lower, or bottom, electrode 45, a first spacer 43 formed on one lateral surface of the lower electrode 45, and a second spacer 47 formed on a lateral surface facing the one lateral surface of the lower electrode 45. A data storage pattern 63 may be formed on the lower electrode 45 and may include, for example, germanium-antimony-tellurium, also referred to herein as GeSbTe, or GST, material. An upper electrode 65 may be formed on the data storage pattern 63. A bit line 75 may be formed on the upper electrode 65. The bit line 75 may include a barrier metal layer 71, a seed layer 72, and a conductive layer 73.

The metal silicide pattern 35 may be self-aligned on the diode 33, for example. The metal silicide pattern 35 may have substantially the same shape as the diode 33. The conductive buffer pattern 39 may have a different shape from the diode 33. For example, the conductive buffer pattern 39 may have a hexahedral shape, while the diode 33 may have a cylindrical shape. The conductive buffer pattern 39 may have a greater planar area than the diode 33. The conductive buffer pattern 39 may completely cover the metal silicide pattern 35. Lateral surfaces of the electrode structure 41 may be vertically aligned with lateral surfaces of the conductive buffer pattern 39. The data storage pattern 63 may be formed between the first and second spacers 43 and 47. The data storage pattern 63 may be self-aligned on the lower electrode 45.

As will be described in greater detail in the discussion related to FIGs. below, the conductive buffer pattern may be formed in one or more layers atop diode 33 and metal silicide pattern 35, which may be sequentially formed within a contact hole, and a molding layer, then later patterned. Rather than forming a W plug within a diode hole, a process that increases in difficulty as feature sizes diminish, a non-volatile memory device in accordance with principles of inventive concepts may form a conductive buffer pattern atop a layer that includes the top of a diode (and metal silicide 35) and molding layer 29. When compared to a process of forming a W plug within a diode hole, the formation of the conductive buffer pattern 39 in accordance with principles of inventive concepts may not only drastically reduce defects, such as seam defects that might be introduced into a W plug, but may also reduce the aspect ratio of a contact hole required for the diode 33, thereby improving manufacturability. Furthermore, as described in greater detail below, the conductive buffer patterns 39 may be continuously formed during a patterning process for forming the electrode structures 41, also improving manufacturability. As compared with a an approach such as forming a W pad and a lower electrode separately, the formation of the conductive buffer pattern 39 in accordance with principles of inventive concepts may simplify the entire process and also prevent alignment errors. As a result, a non-volatile memory device in accordance with principles of inventive concepts may be readily manufacturable and may provide superior performance.

Referring to FIG. 3, word lines 25 may be formed in a cell array region of the non-volatile memory device and may be parallel to one another. Upper electrodes 65 may be formed over and across the word lines 25. Bit lines 75 may be formed on the upper electrodes 65. Diodes 33, conductive buffer patterns 39, lower electrodes 45, and data storage patterns 63 may be formed at intersections between the word lines 25 and the bit lines 75.

Referring to FIGS. 3 and 4, an isolation layer 23 defining active regions 22 may be formed in predetermined regions of a substrate 21. The word lines 25 may be formed within the active regions 22. A molding layer 29 may be formed on the word lines 25 and the isolation layer 23. Contact holes 29H may be formed through the molding layer 29. A first semiconductor pattern 31, a second semiconductor pattern 32, and a metal silicide pattern 35 may be sequentially stacked within each of the contact holes 29H. The first and second semiconductor patterns 31 and 32 may constitute the diode 33. Top surfaces of the metal silicide patterns 35 and the molding layer 29 may be formed at substantially the same level. The diodes 33 and the metal silicide patterns 35 may completely fill the contact holes 29H.

Insulating lines 53 may be formed on the molding layer 29 and separated from one another. The insulating lines 53 may have bar shapes parallel to one another. Insulating patterns 49 may be formed between the insulating lines 53 on the molding layer 29 and separated from one another. Conductive buffer patterns 39 may be formed between the insulating patterns 49 and overlap the metal silicide patterns 35. Electrode structures 41 may be formed on the conductive buffer patterns 39 between the insulating patterns 49. Each of the electrode structures 41 may include the lower electrode 45, the first spacer 43 disposed on the one lateral surface of the lower electrode 45, and the second spacer 47 formed on the lateral surface facing the one lateral surface of the lower electrode 45. The lower electrode 45 may include an upper part 45A having a vertical height greater than a horizontal width thereof, and a lower part 45B having a horizontal width greater than a vertical height thereof. For example, the lower electrode 45 may have an L shape.

The insulating patterns 49 may intersect the insulating lines 53 at right angles. Bottoms of the insulating patterns 49 may be formed lower than top ends of the metal silicide patterns 35. The molding layer 29 may be interposed between the insulating patterns 49 and the metal silicide patterns 35. Additionally, the bottoms of the insulating patterns 49 may be formed lower than top ends of the second semiconductor patterns 32. In such a case, the molding layer 29 may be interposed between the insulating patterns 49 and the second semiconductor patterns 32.

Lateral surfaces of the conductive buffer patterns 39 and the electrode structures 41 may be in contact with the insulating patterns 49. Lateral surfaces of the electrode structures 41 may be vertically aligned with the lateral surfaces of the conductive buffer patterns 39. The second spacer 47 may contact a top surface of the lower part 45B of the lower electrode 45, and contact one lateral surface of the upper part 45B thereof. In an exemplary embodiment in accordance with principles of inventive concepts, one lateral surface of the second spacer 47, one lateral surface of the lower part 45B, and one lateral surface of the conductive buffer pattern 39 may be vertically aligned with one another. In such a case, one lateral surface of each of the insulating patterns 49 may contact the second spacer 47, the lower part 45B, and the conductive buffer pattern 39.

The first spacer 43 may contact a lateral surface facing the one lateral surface of the upper part 45A, a lateral surface facing the one lateral surface of the lower part 45B, and a top surface of the conductive buffer pattern 39. One lateral surface of the first spacer 43 may be vertically aligned with a lateral surface of the conductive buffer pattern 39 facing the one lateral surface of the conductive buffer pattern 39. In such a case, the insulating patterns 49 may contact the first spacers 43 and the conductive buffer patterns 39.

Bottoms of the insulating lines 53 may also be formed lower than the top ends of the metal silicide patterns 35. The molding layer 29 may be interposed between the insulating lines 53 and the metal silicide patterns 35. Additionally, the bottoms of the insulating lines 53 may be formed lower than the top ends of the second semiconductor patterns 32. In such a case, the molding layer 29 may be interposed between the insulating lines 53 and the second semiconductor patterns 32. Furthermore, the bottoms of the insulating lines 53 may be formed at a different level from the bottoms of the insulating patterns 49. For example, in exemplary embodiments in accordance with principles of inventive concepts, the bottoms of the insulating lines 53 may be formed lower than the bottoms of the insulating patterns 49. The lateral surfaces of the conductive buffer patterns 39 and the lateral surfaces of the electrode structures 41 may contact the insulating lines 53. Lateral surfaces of the lower electrodes 45 may also contact the insulating lines 53. Top ends of the insulating lines 53, the insulating patterns 49, and the electrode structures 41 may be formed at substantially the same level.

The data storage patterns 63 may be formed on the upper parts 45A of the lower electrodes 45. Each of the data storage patterns 63 may be formed between the first spacer 43 and the second spacer 47. Each of the data storage patterns 63 may be self-aligned on the upper part 45A of the lower electrode 45. Lateral surfaces of the data storage patterns 63 may be vertically aligned with lateral surfaces of the upper parts 45A thereof. Top ends of the data storage patterns 63 may be formed at substantially the same level as top ends of the first and second spacers 43 and 47. Each of the data storage patterns 63 may be surrounded with the insulating lines 53 and the first and second spacers 43 and 47.

The upper electrodes 65 may be formed on the data storage patterns 63. An upper insulating layer 67 may be formed on the insulating lines 53, the insulating patterns 49, and the upper electrodes 65. The bit lines 75 may be formed to penetrate the upper insulating layer 67 and contact the upper electrodes 65. Each of the bit lines 75 may include the barrier metal layer 71, the seed layer 72, and the conductive layer 73 stacked sequentially.

Referring to FIG. 5, each of the conductive buffer patterns 39A may have a trapezoidal shape having a lower width greater than an upper width thereof. In other exemplary embodiments in accordance with principles of inventive concepts, each of the conductive buffer patterns 39A may have an inverse trapezoidal shape having an upper width greater than a lower width thereof.

Embodiment 2

FIGS. 6 through 9 are cross-sectional views of non-volatile memory devices according to a second exemplary embodiment in accordance with principles of inventive concepts.

Figure 6:
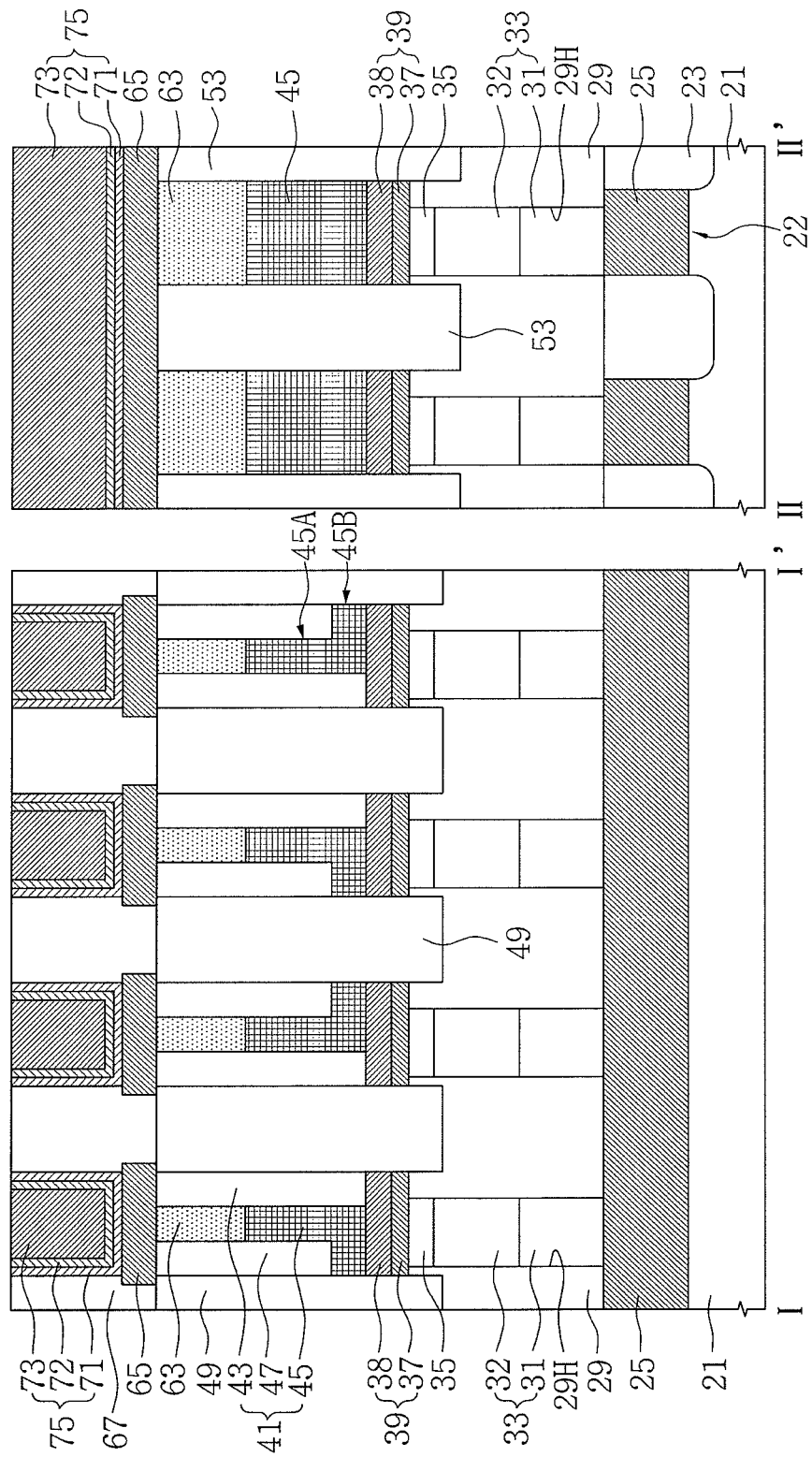
FIGS. 6 through 9 are cross-sectional views of non-volatile memory devices according to second embodiments of the inventive concept.

Referring to FIG. 6, a central axis of a conductive buffer pattern 39 may deviate from a central axis of a contact hole 29H. In such a case, the central axis of the conductive buffer pattern 39 may deviate from a central axis of the diode 33. The conductive buffer pattern 39 may have a greater horizontal width than the contact hole 29H. The conductive buffer pattern 39 may completely cover a metal silicide pattern 35.

Figure 7:
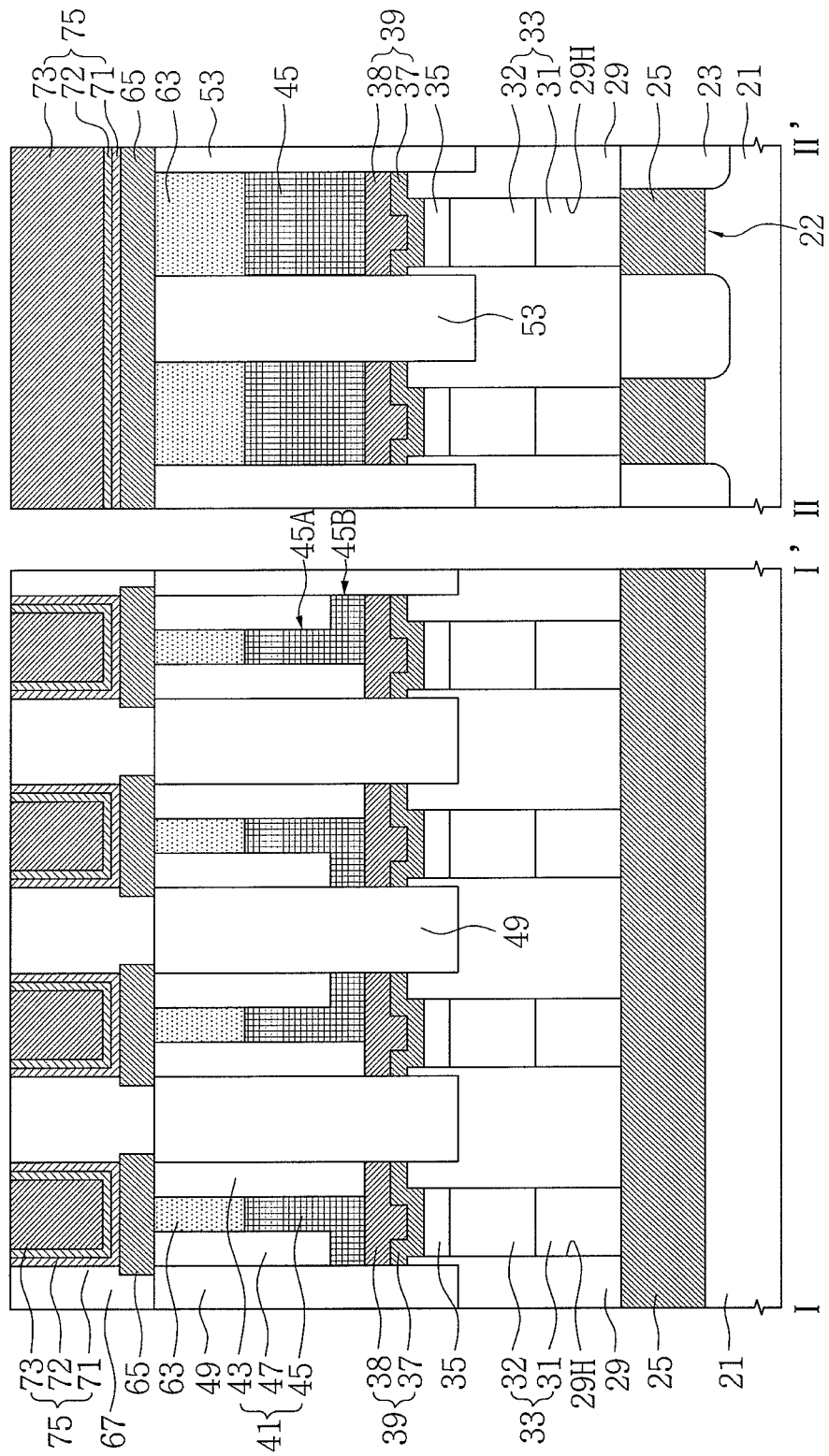

Referring to FIG. 7, a top end of the metal silicide pattern 35 may be formed lower than a top end of a molding layer 29. A bottom end of a first conductive pattern 37 may extend into the contact hole 29H. A second conductive pattern 38 may be formed on the first conductive pattern 37. The first and second conductive patterns 37 and 38 may constitute a conductive buffer pattern 39. The central axis of the conductive buffer pattern 39 may deviate from the central axis of the diode 33. An electrode structure 41 may be self-aligned on the conductive buffer pattern 39.

Figure 8:
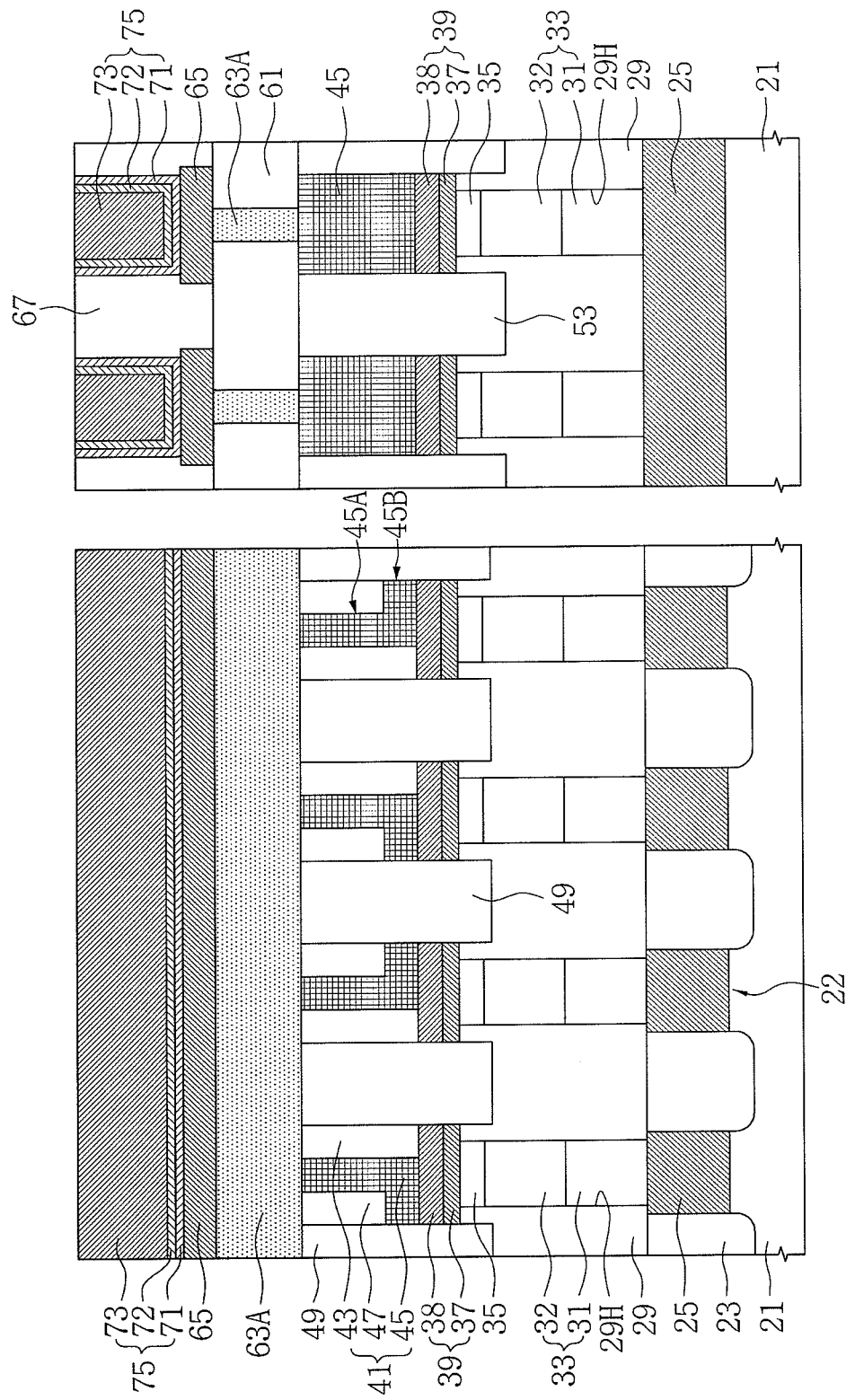

Referring to FIG. 8, an interlayer insulating layer 61 may be formed on the electrode structure 41, insulating lines 53, and insulating patterns 49. Data storage patterns 63A may be formed through the interlayer insulating layer 61 over and across the lower electrodes 45. The data storage patterns 63A may have line shapes parallel to one another. Upper electrodes 65 may be formed on the data storage patterns 63A.

Figure 9:
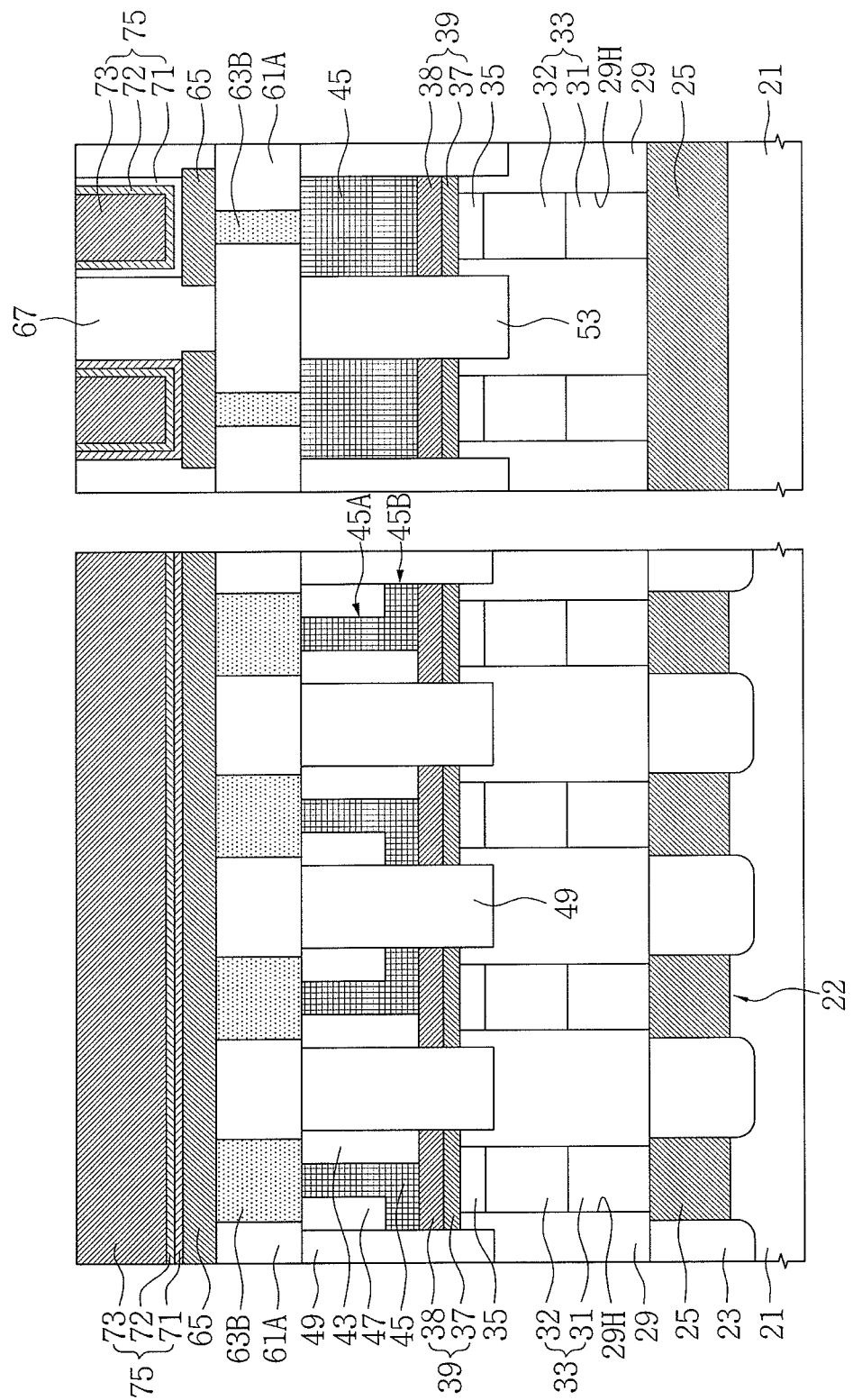

Referring to FIG. 9, data storage patterns 63B may be formed through the interlayer insulating layer 61A over and across the lower electrodes 45. The data storage patterns 63B may have bar shapes.

Embodiment 3

Figure 19:
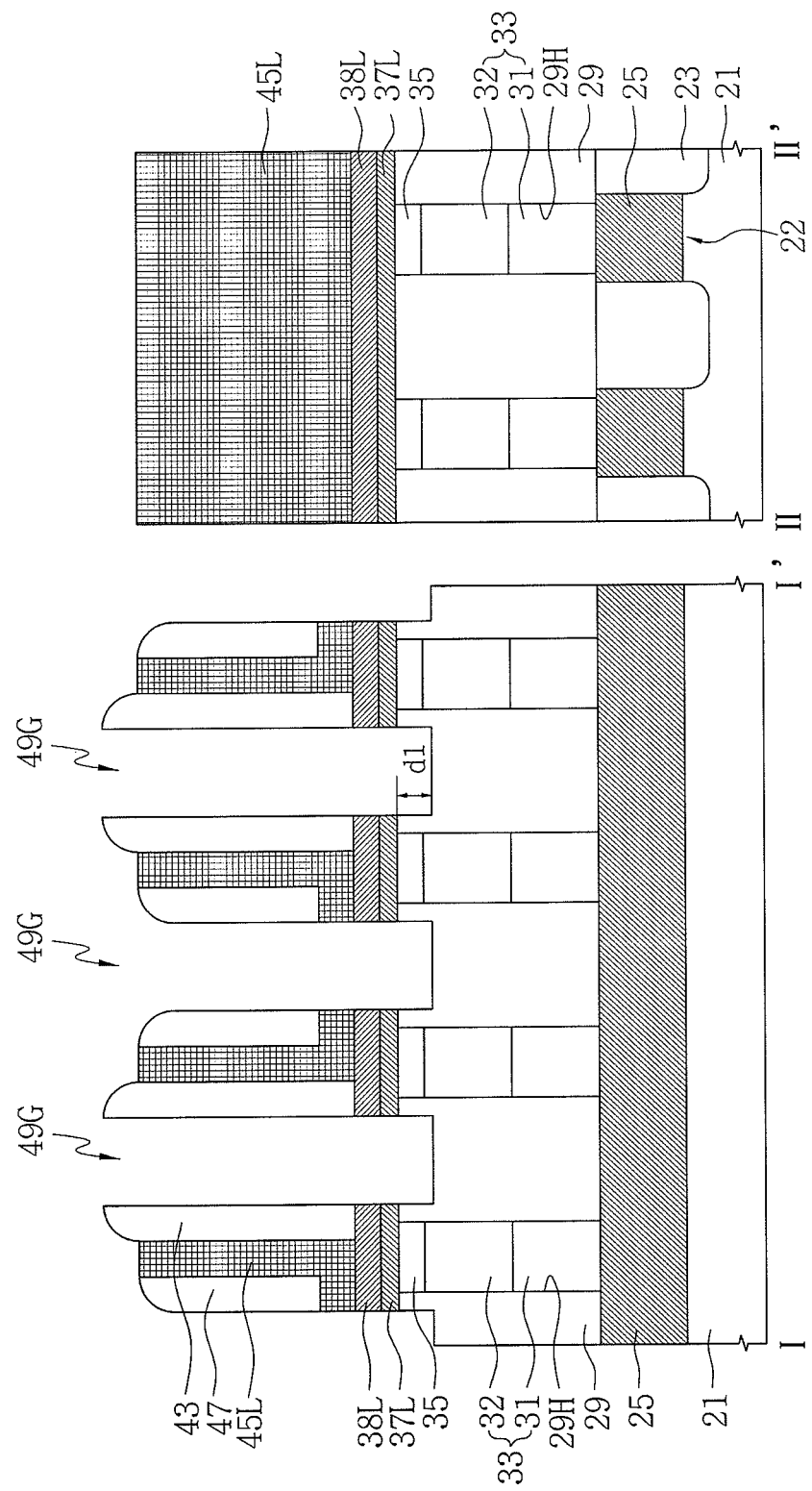
Figure 20:
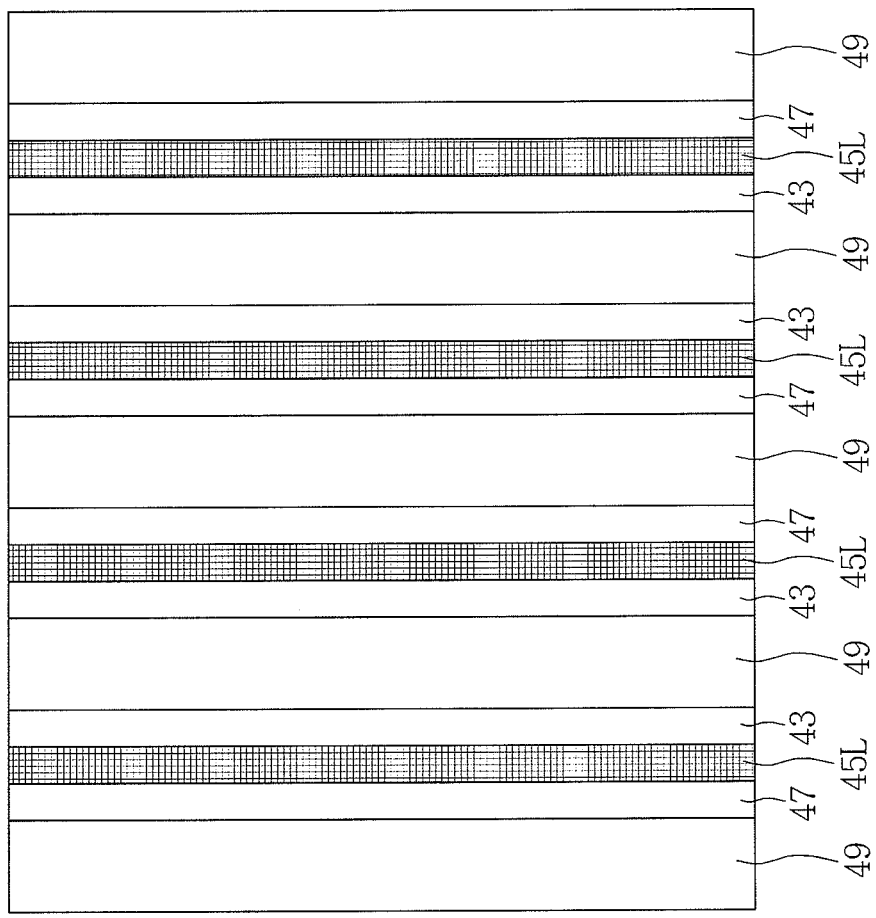
FIGS. 20 and 23 are top views of the method according to the third embodiments of the inventive concept.
Figure 22:
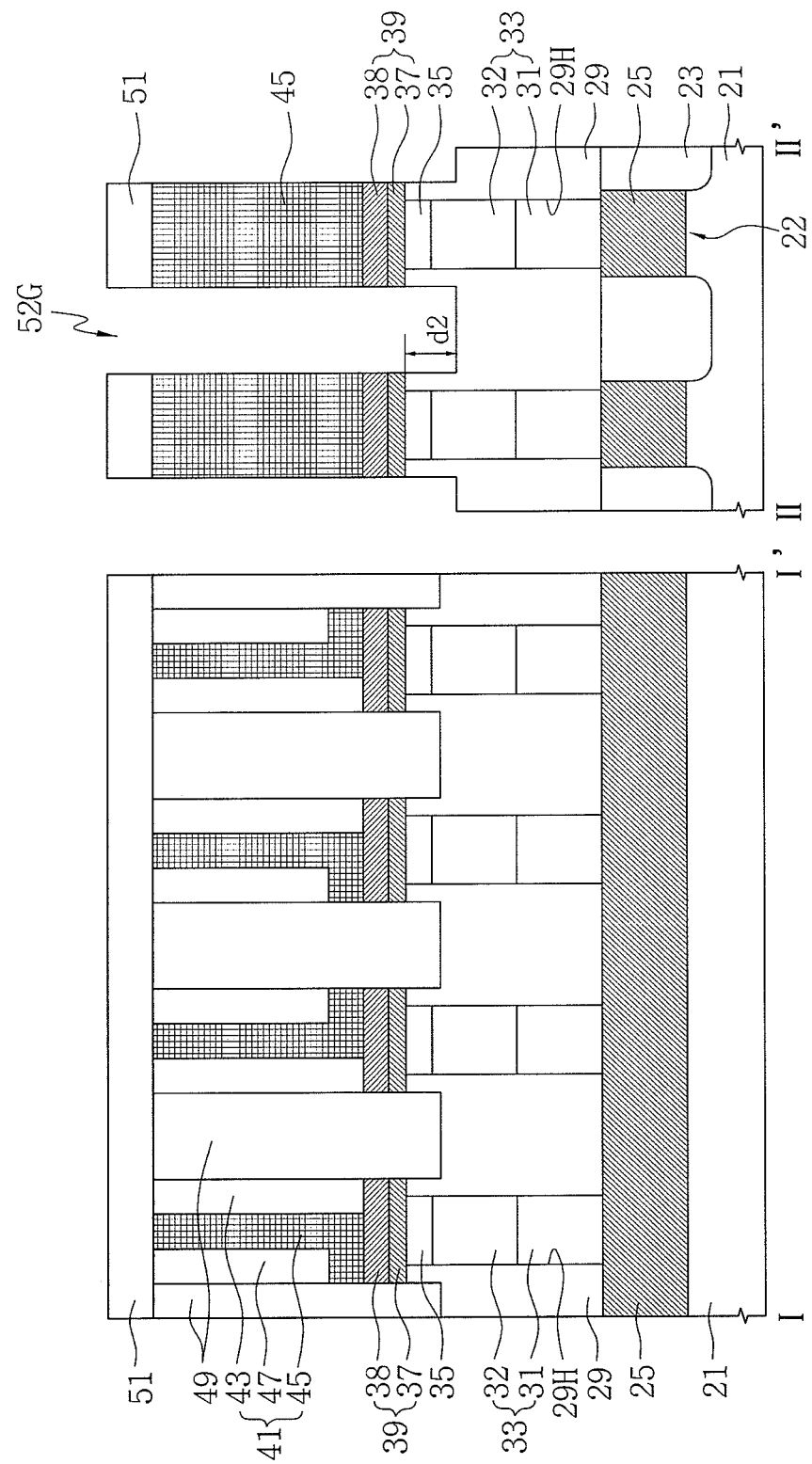
Figure 23:
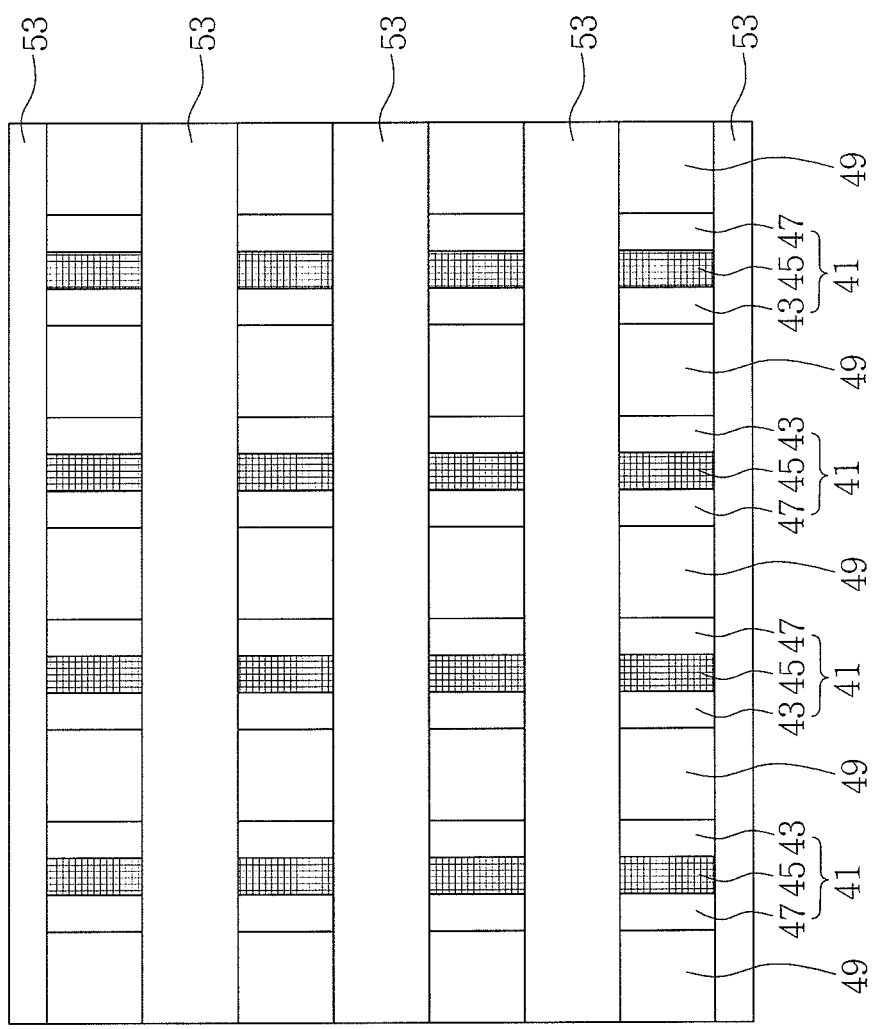

FIGS. 10 through 19, 21, 22, and 24 through 27 are cross-sectional views taken along lines I-I' and II-II' of FIG. 3, illustrating a method of fabricating a non-volatile memory device according to a third exemplary embodiment in accordance with principles of inventive concepts, and FIGS. 20 and 23 are top views illustrating a method in accordance with principles of inventive concepts. The layout, top views, and cross-sectional views of FIGS. 3 and 10 through 27 may correspond to a cell region of a PRAM, for example.

Figure 10:
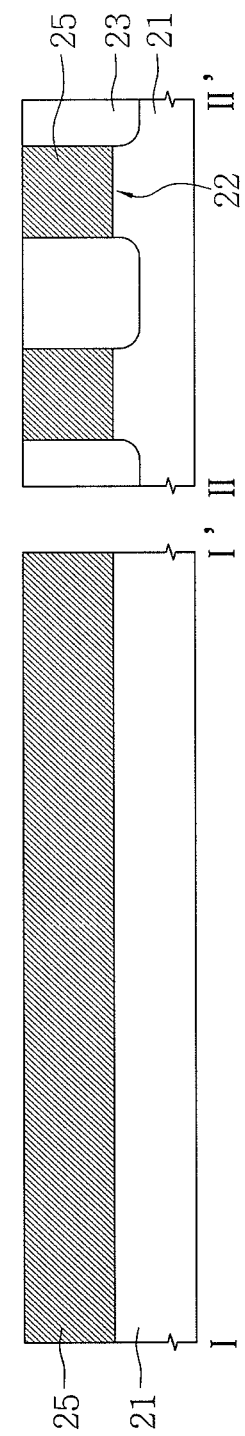
FIGS. 10 through 19, 21, 22, and 24 through 27 are cross-sectional views taken along lines I-I' and II-II' of FIG. 3, illustrating a method of fabricating a non-volatile memory device according to third embodiments of the inventive concept.

Referring to FIGS. 3 and 10, an isolation layer 23 defining active regions 22 may be formed in predetermined regions of a substrate 21. Word lines 25 may be formed within the active regions 22. The word lines 25 may be parallel to one another. The isolation layer 23 may be formed between the word lines 25.

The substrate 21 may be a semiconductor substrate, such as a single-crystalline silicon wafer or a silicon-on-insulator (SOI) wafer, for example. Hereinafter, for descriptive purposes, it is assumed that the substrate 21 is a silicon wafer containing p-type impurity ions. The isolation layer 23 may be formed using a shallow trench isolation (STI) technique. The isolation layer 23 may include silicon oxide, silicon nitride, silicon oxynitride, or a combination thereof, for example. The word lines 25 may be formed by implanting n-type impurity ions into the active regions 22.

In other exemplary embodiments in accordance with principles of inventive concepts, although the word lines 25 may be conductive patterns formed on the substrate 21, a detailed description of the word lines 25 will be omitted for brevity.

Figure 11:
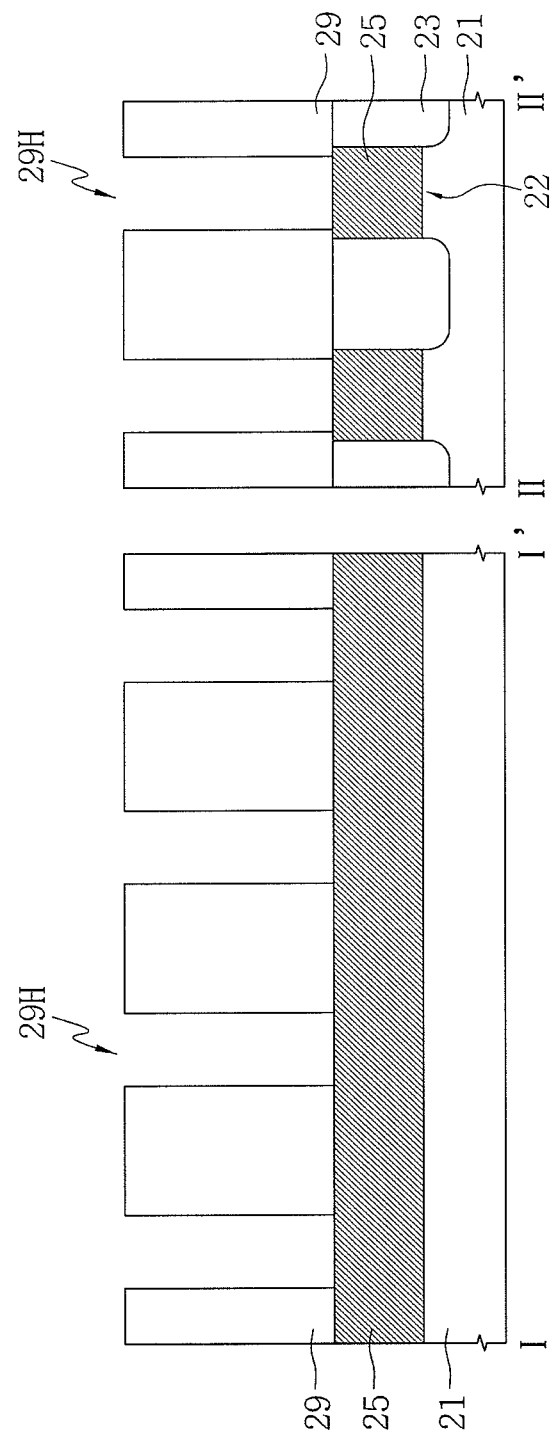

Referring to FIGS. 3 and 11, a molding layer 29 may be formed on the substrate 21 having the word lines 25. Contact holes 29H may be formed through the molding layer 29 and expose the word lines 25. The contact holes 29H may be aligned at predetermined intervals along the word lines 25. The contact holes 29H may be separated from one another. Each of the contact hole 29H may have an aspect ratio of 10:1 or higher, for example.

The molding layer 29 may include silicon oxide, silicon nitride, silicon oxynitride, or a combination thereof, for example. The molding layer 29 may cover the word lines 25 and the isolation layer 23. Although an etch stop layer may, additionally, be formed between the word lines 25 and the molding layer 29, a description thereof will be omitted for brevity. The contact holes 29H may be formed using a patterning technique. For example, the formation of the contact holes 29H may be performed using photolithography and anisotropic etching processes. Each of the contact holes 29H may have one of various shapes, such as a circular shape, a tetragonal shape, or a tetragonal shape having round corners. Each of the contact holes 29H may have a smaller width than each of the word lines 25.

Figure 12:
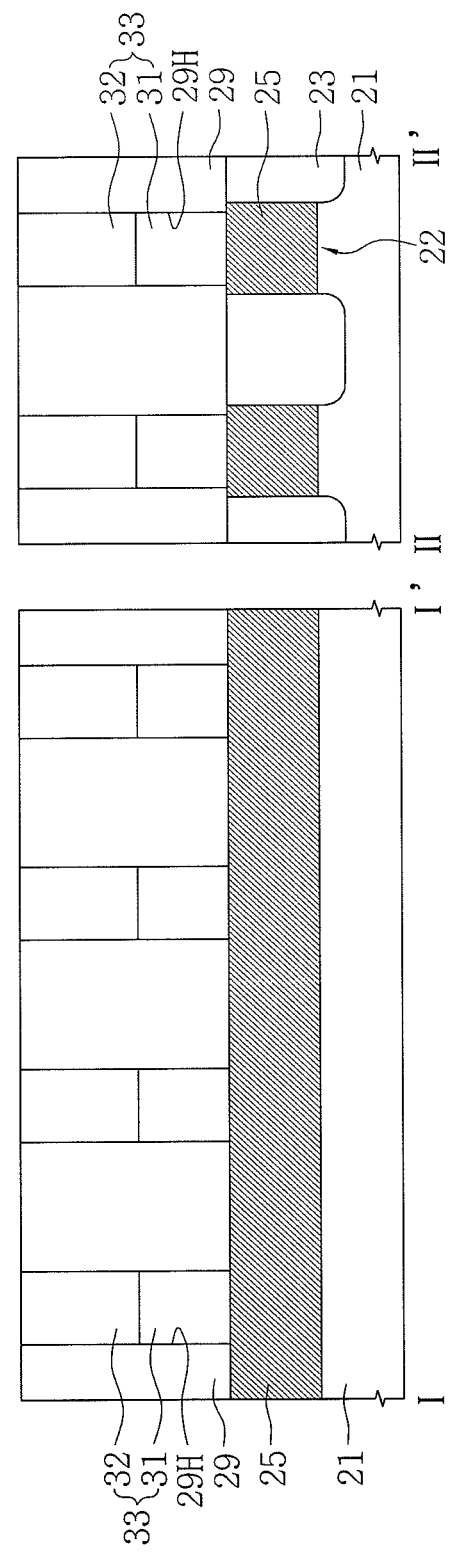

Referring to FIGS. 3 and 12, a first semiconductor pattern 31 and a second semiconductor pattern 32 may be sequentially formed within each of the contact holes 29H. The first and second semiconductor patterns 31 and 32 may constitute a diode 33. A top surface of the second semiconductor pattern 32 may be planarized using a chemical mechanical polishing (CMP) and/or an etchback process, for example. In such a case, top ends of the diode 33 and the molding layer 29 may be formed at the same level. The diode 33 may serve as a switching device.

The first and second semiconductor patterns 31 and 32 may be formed using a selective epitaxial growth (SEG) technique, for example. The first semiconductor pattern 31 may be formed between the second semiconductor pattern 32 and the word lines 25. The first semiconductor pattern 31 may include a silicon layer containing n-type impurity ions. The semiconductor pattern 32 may include a silicon layer containing p-type impurity ions.

In other embodiments, the first and second semiconductor patterns 31 and 32 may be stacked in the reverse order. In other embodiments, the first semiconductor pattern 31 may be omitted.

Figure 13:
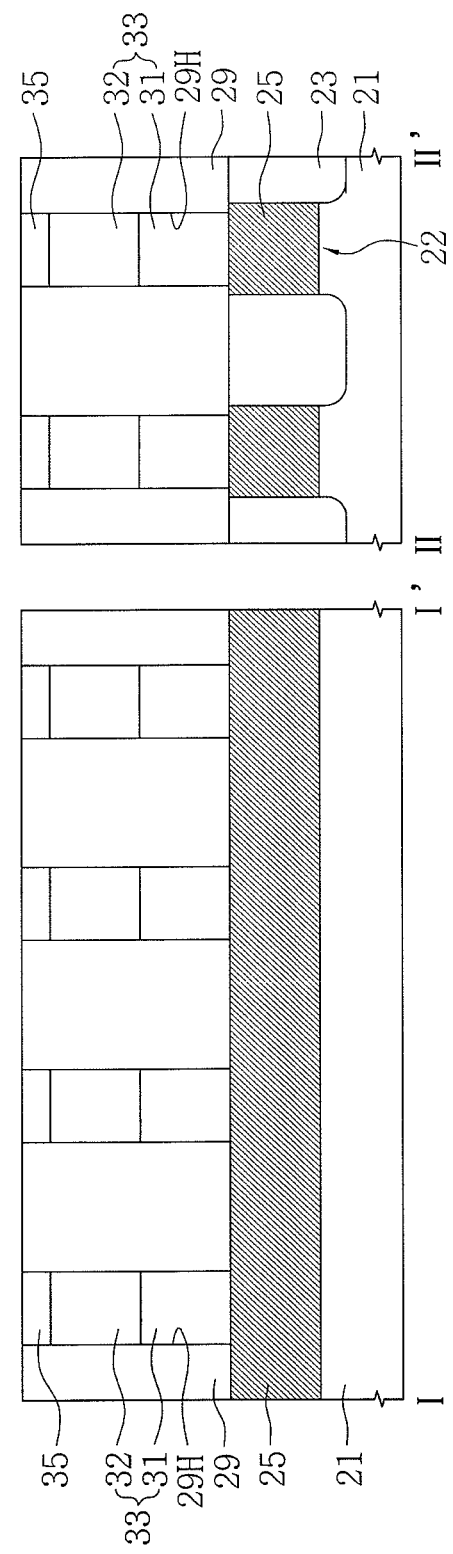

Referring to FIGS. 3 and 13, a metal silicide pattern 35 may be formed on the diode 33. The metal silicide pattern 35 may be in contact with the second semiconductor pattern 32. A top surface of the metal silicide pattern 35 may be formed at the same level as a top surface of the molding layer 29. The metal silicide pattern 35 may include cobalt silicide (CoSi), nickel silicide (NiSi), tungsten silicide (WSi), titanium silicide (TiSi), or tantalum silicide (TaSi), for example. In an exemplary embodiment in accordance with principles of inventive concepts, the metal silicide pattern 35 may be formed of a CoSi layer.

Figure 14:
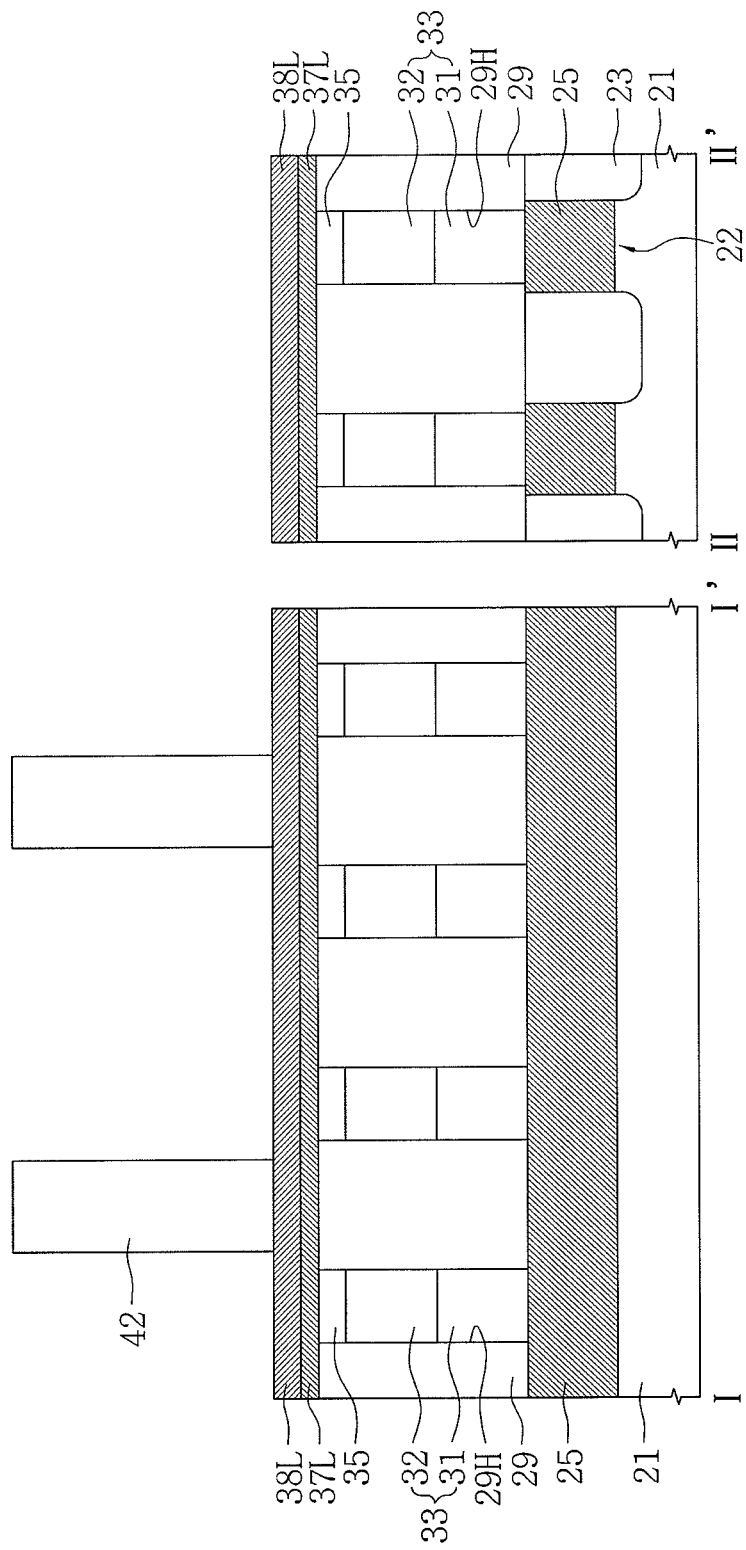

Referring to FIGS. 3 and 14, a first conductive layer 37L and a second conductive layer 38L may be sequentially formed on the metal silicide pattern 35 and the molding layer 29. The first conductive layer 37L may contact the metal silicide pattern 35 and cover the molding layer 29. Sacrificial patterns 42 may be formed on the second conductive layer 38L. Each of the sacrificial patterns 42 may have a bar shape. The sacrificial patterns 42 may be formed using a thin-film forming process and a patterning process, for example. In an exemplary embodiment in accordance with principles of inventive concepts, the patterning process may include a photolithography process.

Each of the first and second conductive layers 37L and 38L may include Ti, titanium nitride (TiN), titanium-aluminum-nitride (TiAlN), titanium carbon nitride (TiCN), TiSiN, titanium oxynitride (TiON), Ta, TaN, TaAlN, TaCN, TaSiN, C, CN, CoSi, CoSiN, W, WN, WSi, WSiN, Ni, or a combination thereof, for example. In an exemplary embodiment in accordance with principles of inventive concepts, the first conductive layer 37L may include a barrier metal layer, such as a Ti/TiN layer, and the second conductive layer 38L may include a W layer.

Figure 15:
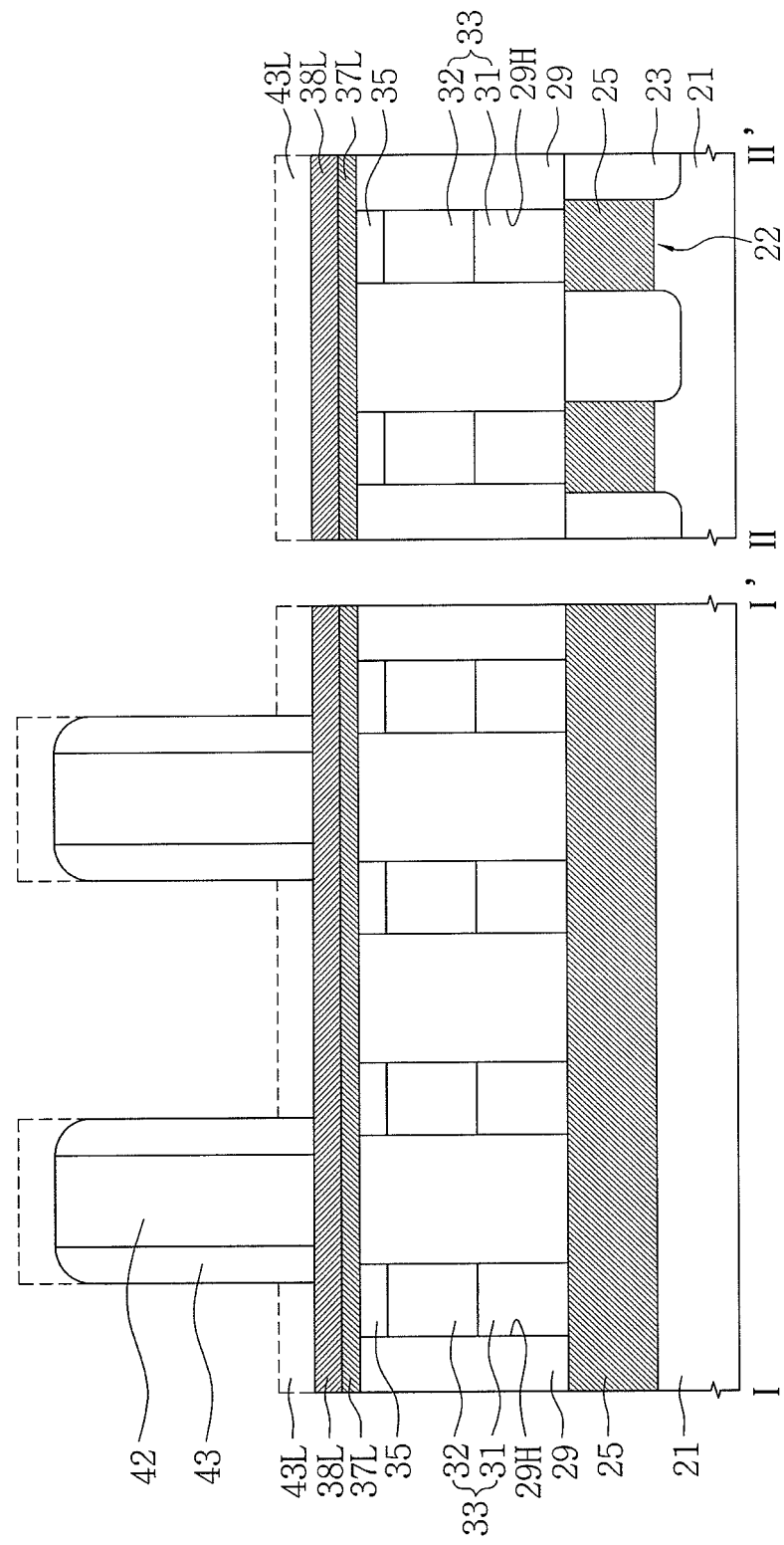

Referring to FIGS. 3 and 15, a first spacer layer 43L may be formed on the entire surface of the substrate 21. The first spacer layer 43L may cover top and lateral surfaces of the sacrificial pattern 42, and cover the second conductive layer 38L, for example. The first spacer layer 43L may be anisotropically etched until the sacrificial pattern 42 and the second conductive layer 38L are exposed, thereby forming first spacers 43 on lateral surfaces of the sacrificial pattern 42. A horizontal width of the first spacers 43 may depend on a deposited thickness of the first spacer layer 43L.

The first spacers 43 may include a material having an etch selectivity with respect to the sacrificial pattern 42 and the molding layer 29. For example, in an exemplary embodiment in accordance with principles of inventive concepts, the sacrificial pattern 42 may include silicon oxide, while the first spacers 43 may include silicon nitride.

Figure 16:
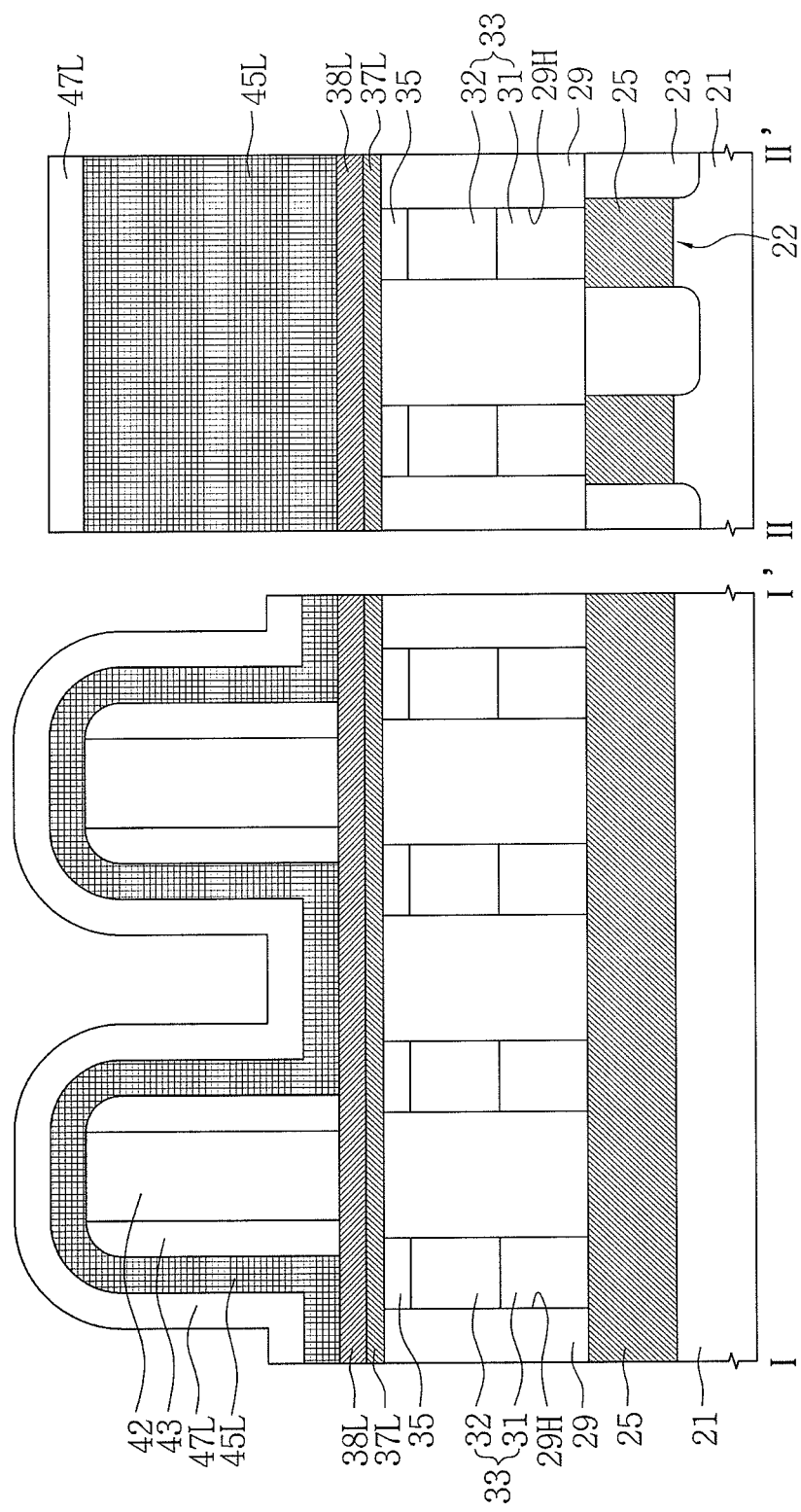

Referring to FIGS. 3 and 16, a lower electrode layer 45L and a second spacer layer 47L may be sequentially stacked on the substrate 21 having the sacrificial pattern 42 and the first spacers 43. The lower electrode layer 45L may cover lateral surfaces of the first spacers 43 and contact the second conductive layer 38L. The second spacer layer 47L may cover the lower electrode layer 45L.

The lower electrode layer 45L may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The second spacer layer 47L may include a material having an etch selectivity with respect to the sacrificial pattern 42 and the molding layer 29. For example, in an exemplary embodiment in accordance with principles of inventive concepts, the second spacer layer 47L may include silicon nitride.

Figure 17:
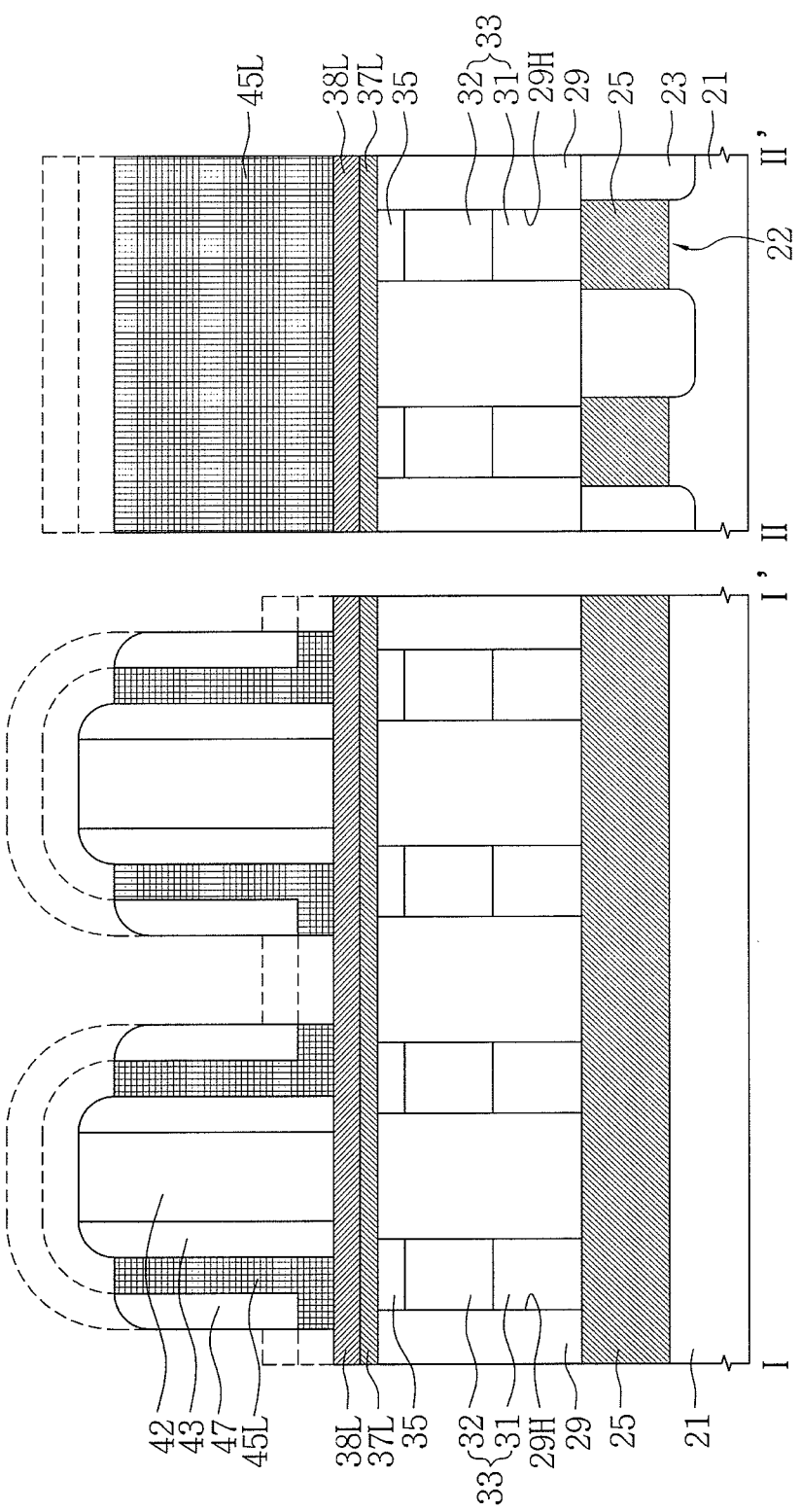

Referring to FIGS. 3 and 17, the second spacer layer 47L may be anisotropically etched until the lower electrode layer 45L is exposed, thereby forming second spacers 47. A horizontal width of the second spacers 47 may depend on a deposited thickness of the second spacer layer 47L. Thereafter, the exposed lower electrode layer 45L may be removed to expose the second conductive layer 38L. As a result, the lower electrode layer 45L may be retained between the first and second spacers 43 and 47. Also, the lower electrode layer 45L may be retained between the second conductive layer 38L and the second spacer 47. Top surfaces of the sacrificial pattern 42 and the first spacers 43 may be exposed.

Figure 18:
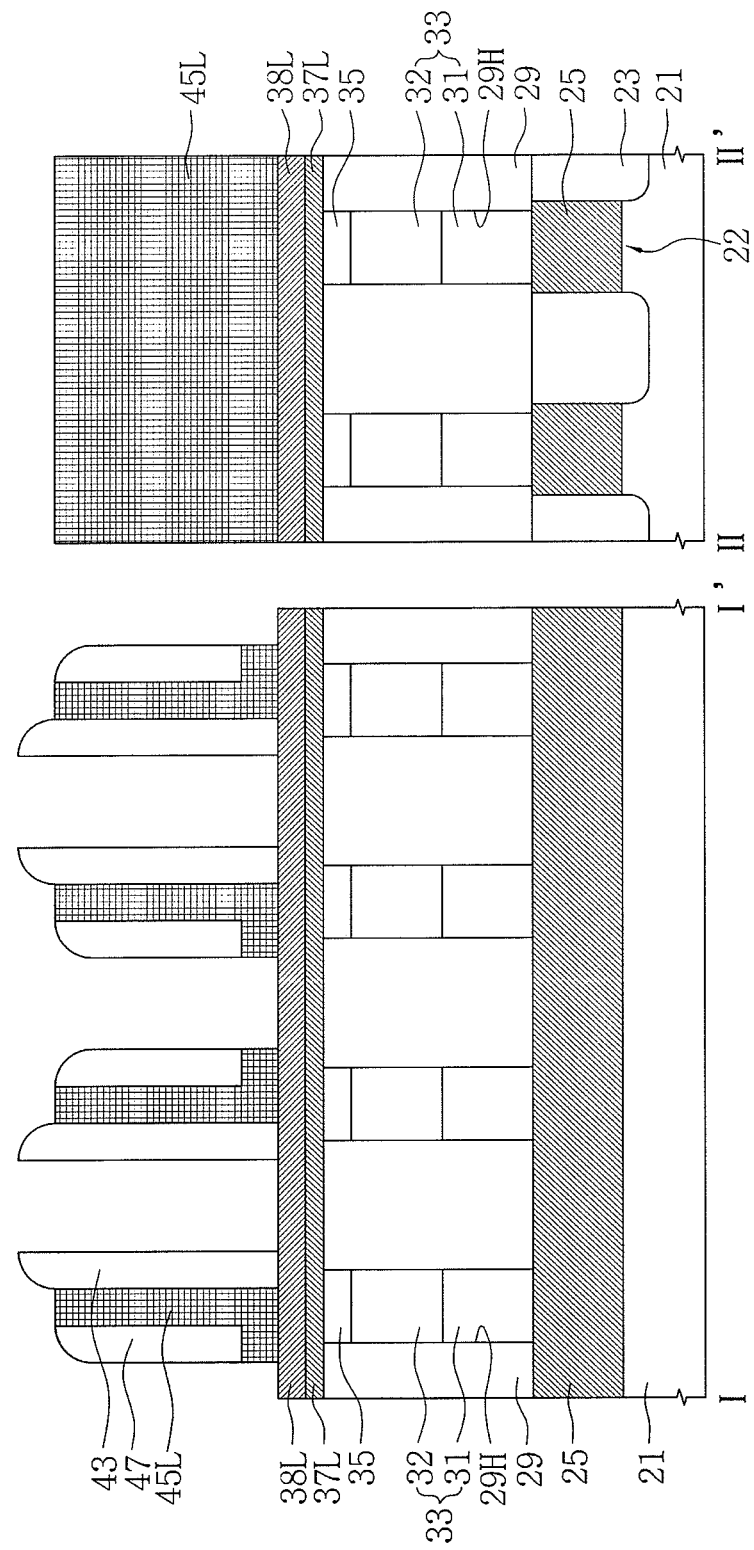

Referring to FIGS. 3 and 18, the sacrificial pattern 42 may be removed to expose the second conductive layer 38L.

Referring to FIGS. 3 and 19, the second conductive layer 38L, the first conductive layer 37L, and the molding layer 29 may be anisotropically etched using the first spacers 43, the lower electrode layer 45L, and the second spacers 47 as an etch mask, thereby forming first grooves 49G. A bottom surface of the first groove 49G may be formed lower than a top end of the molding layer 29 by a first depth d1. The bottom surface of the first groove 49G may be formed lower than the metal silicide pattern 35. Furthermore, the bottom surface of the first groove 49G may be formed lower than a top end of the diode 33. In such a case, the molding layer 29 may be retained between the first groove 49G and the diode 33.

Figure 21:
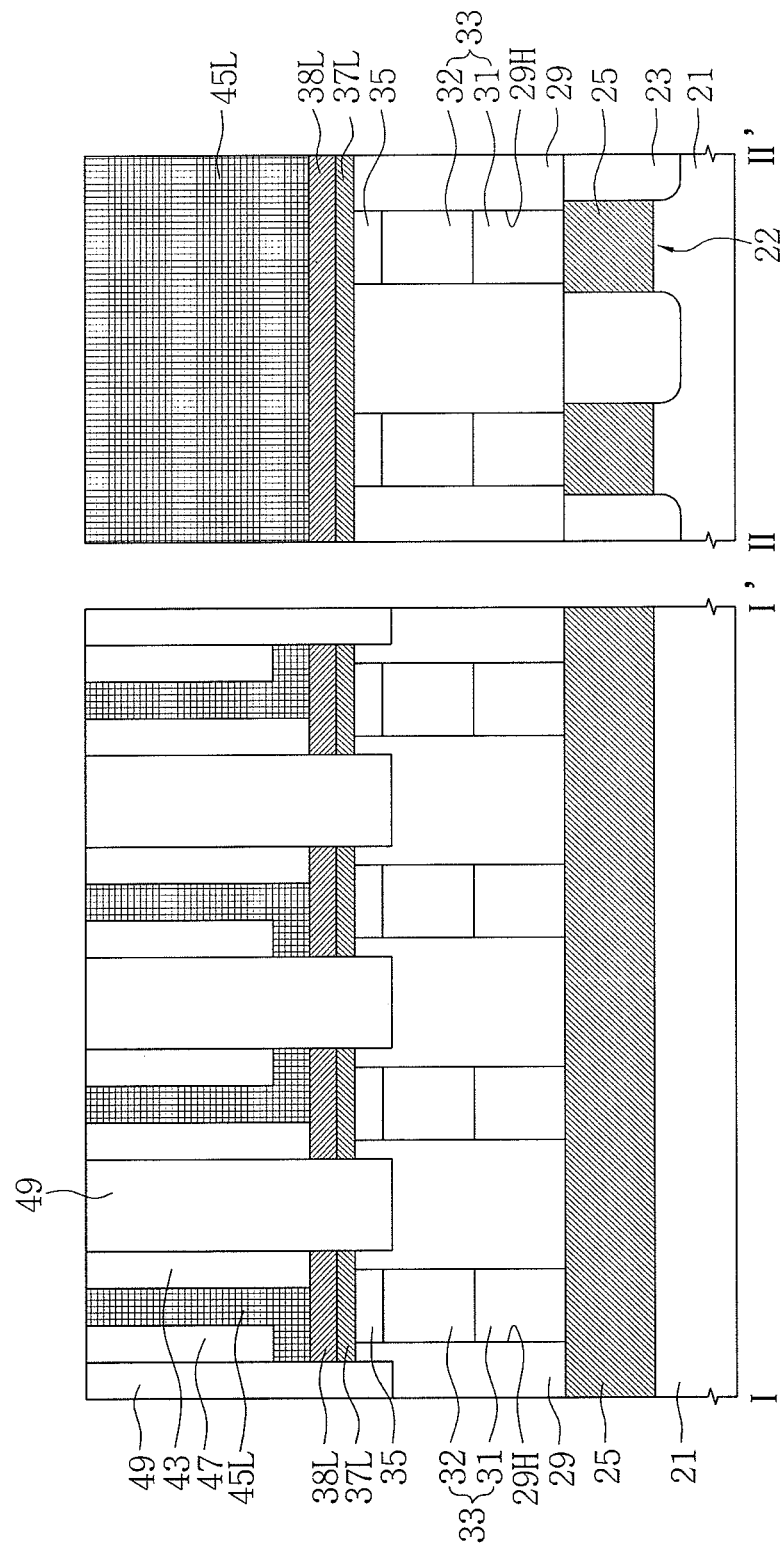

Referring to FIGS. 3, 20, and 21, the lower electrode layer 45L may have a line shape from a top view. Insulating patterns 49 may be formed to fill the first grooves 49G. The insulating patterns 49 may be formed using a thin-film forming process and a planarization process. The insulating patterns 49 may include silicon oxide, silicon nitride, silicon oxynitride, or a combination thereof. For example, in exemplary embodiments in accordance with principles of inventive concepts, the insulating patterns 49 may include silicon nitride.

Referring to FIGS. 3 and 22, a mask pattern 51 may be formed on the insulating patterns 49, the first spacers 43, the lower electrode layer 45L, and the second spacers 47. The mask pattern 51 may be formed over and across the insulating patterns 49, the first spacers 43, the lower electrode layer 45L, and the second spacers 47. The mask pattern 51 may intersect the insulating patterns 49, the first spacers 43, the lower electrode layer 45L, and the second spacers 47 at right angles. The mask pattern 51 may be formed using a photolithography process, for example.

The insulating patterns 49, the first spacers 43, the lower electrode layer 45L, the second spacers 47, the second conductive layer 38L, the first conductive layer 37L, and the molding layer 29 may be anisotropically etched using the mask pattern 51 as an etch mask, thereby forming second grooves 52G and conductive buffer patterns 39. The second grooves 52G may intersect the first grooves 49G at right angles. A bottom surface of the second groove 52G may be formed lower than the top end of the molding layer 29 by as much as a second depth d2. The second depth d2 may differ from the first depth d1. The second depth d2 may be greater than the first depth d1. The bottom surface of the second groove 52G may be formed lower than the metal silicide pattern 35. Furthermore, the bottom surface of the second groove 52G may be formed lower than the top end of the diode 33. In such a case, the molding layer 29 may be retained between the second groove 52G and the diode 33.

The lower electrode layer 45L may be partially removed to form a plurality of lower electrodes 45. Each of the lower electrodes 45 may be retained between the first and second spacers 43 and 47. The lower electrode 45 and the first and second spacers 43 and 47 may constitute an electrode structure 41.

Each of the conductive buffer patterns 39 may include a first conductive pattern 37 and a second conductive pattern 38 stacked sequentially. The conductive buffer pattern 39 may, for example, be self-aligned with the electrode structure 41. Lateral surfaces of the conductive buffer pattern 39 may be vertically aligned with lateral surfaces of the electrode structure 41.

Figure 24:
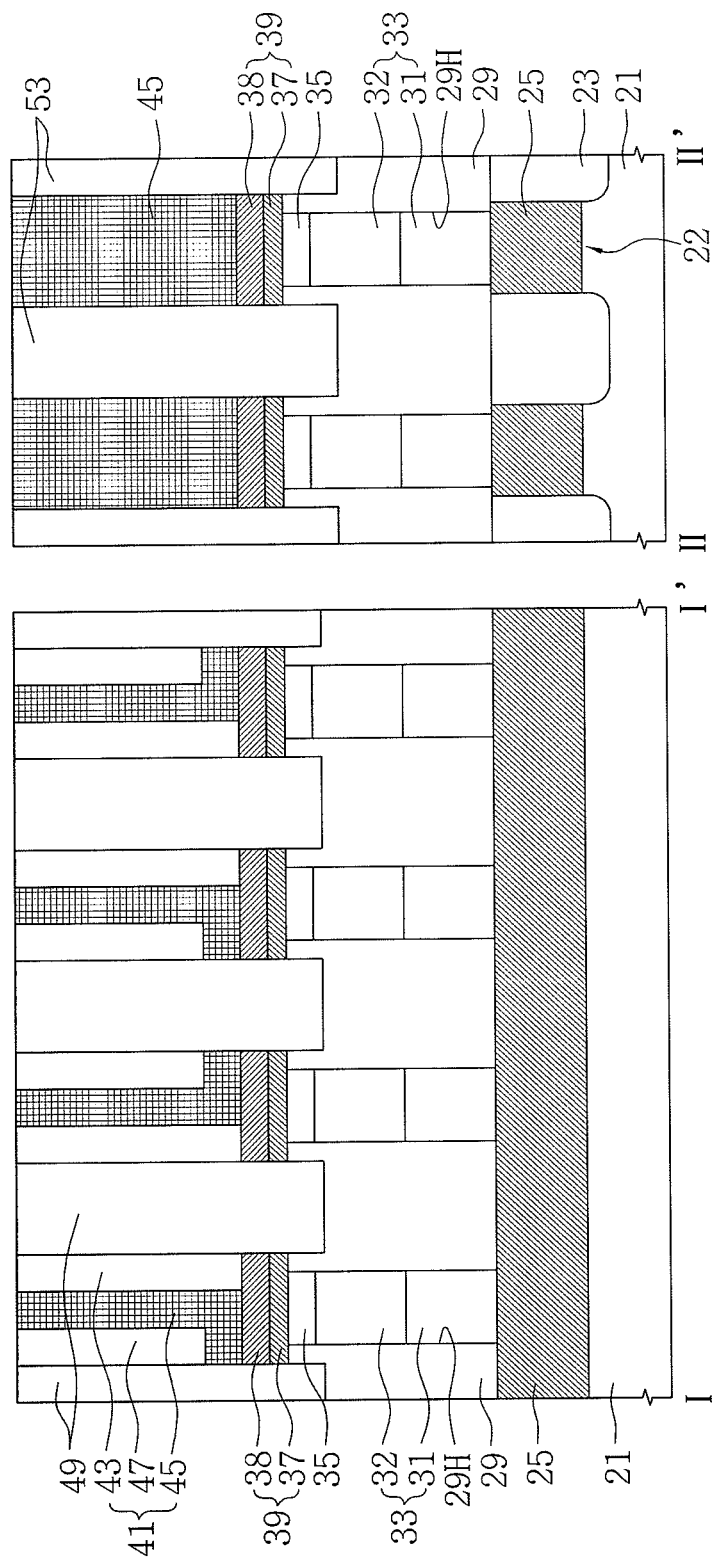

Referring to FIGS. 3, 23, and 24, insulating lines 53 may be formed to fill the second grooves 52G. The formation of the insulating lines 53 may be performed using a thin-film forming process and a planarization process, for example. Top surfaces of the insulating lines 53, the electrode structures 41, and the insulating patterns 49 may be exposed on substantially the same plane surface. The insulating lines 53 may be parallel to one another. The insulating lines 53 may intersect the insulating patterns 49 at right angles. The insulating patterns 49 may be retained between the insulating lines 53. The insulating lines 53 may include silicon oxide, silicon nitride, silicon oxynitride, or a combination thereof. For example, the insulating lines 53 may include silicon nitride.

As shown in FIG. 23, each of the lower electrodes 45 may have a dash shape. The lower electrode 45 may be retained between the first and second spacers 43 and 47. The electrode structure 41 may be interposed between the insulating patterns 49. The electrode structure 41 and the insulating patterns 49 may, for example, be interposed between the insulating lines 53.

During the formation of the insulating lines 53, the mask pattern 51 may be removed. In other exemplary embodiments in accordance with principles of inventive concepts, the mask pattern 51 may be removed before the insulating lines 53 are formed.

Figure 25:
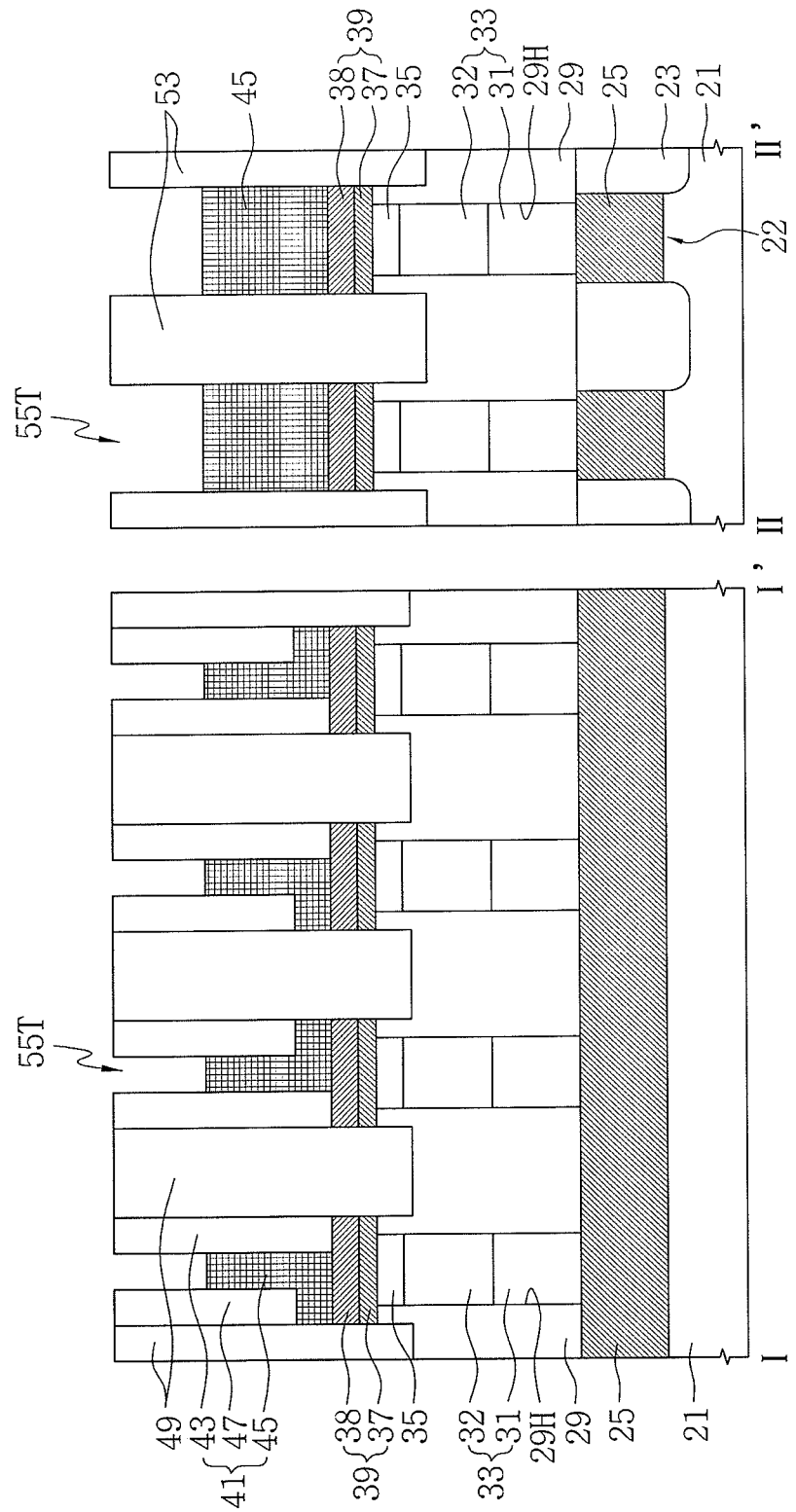

Referring to FIGS. 3 and 25, the lower electrodes 45 may be partially removed to form trenches 55T. The partial removal of the lower electrodes 45 may include an etchback process, for example. The lower electrodes 45 may be retained at a level lower than top ends of the first and second spacers 43 and 47. The trenches 55T may be confined between the first spacers 43 and the second spacers 47. The insulating lines 53, the first spacers 43, and the second spacers 47 may be exposed by sidewalls of the trenches 55T.

Figure 26:
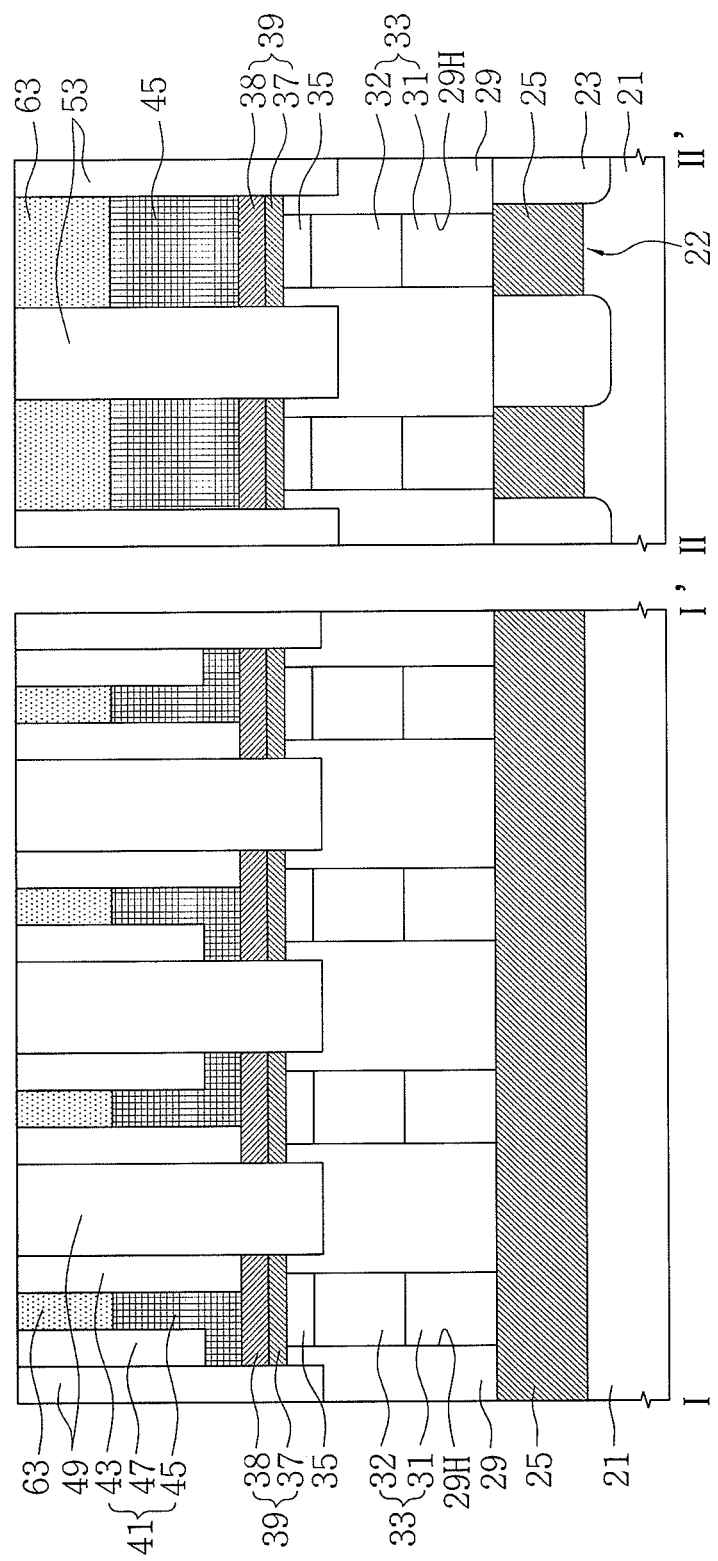

Referring to FIGS. 3 and 26, data storage patterns 63 may be formed to fill the trenches 55T. The formation of the data storage patterns 63 may be performed using thin-film forming and planarization processes, for example. The data storage patterns 63 may be self-aligned on the lower electrodes 45. At least one lateral surface of each of the data storage patterns 63 may be vertically aligned on one lateral surface of the corresponding one of the lower electrodes 45.

Each of the data storage patterns 63 may include a phase-change plug, a polymer plug, a nanoparticle plug, or a resistance-change plug, for example. In an exemplary embodiment in accordance with principles of inventive concepts, for example, the resistance-change plug may include a $SrTiO_3$ layer. Also, when each of the data storage patterns 63 includes a phase-change plug, the phase-change plug may include germanium-antimony-telluride (GeSbTe), germanium-tellurium-arsenide (GeTeAs), tin-tellurium-tin (SnTeSn), GeTe, SbTe, selenium-tellurium-tin (SeTeSn), GeTeSe, antimony-selenium-bismuth (SbSeBi), GeBiTe, GeTeTi, indium-selenium (InSe), GaTeSe, or InSbTe, for example. Furthermore, the phase-change plugs may include a material layer obtained by adding one selected from the group consisting of carbon (C), nitrogen (N), Si, and oxygen (O) to one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, an InSe layer, a GaTeSe layer, and an InSbTe layer, for example.

Figure 27:
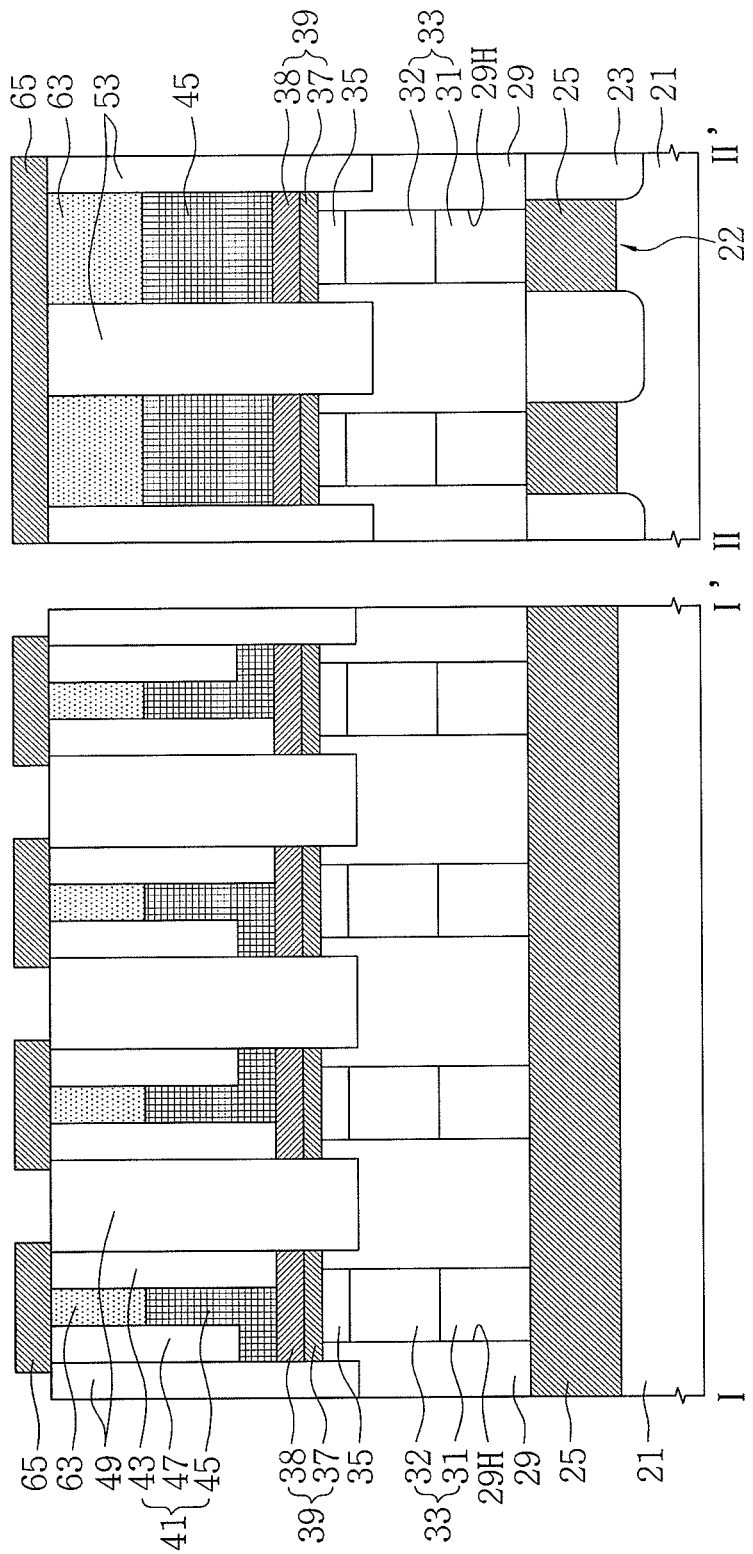

Referring to FIGS. 3 and 27, upper electrodes 65 may be formed on the data storage patterns 63. The upper electrodes 65 may intersect the word lines 25 at right angles. The upper electrodes 65 may have a greater width than the data storage patterns 63. The upper electrodes 65 may be in contact with the data storage patterns 63. The upper electrodes 65 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, for example, or a combination thereof.

Referring back to FIGS. 3 and 4, an upper insulating layer 67 may be formed to cover the upper electrodes 65. Bit lines 75 may be formed to penetrate the upper insulating layer 67 and contact the upper electrodes 65. Each of the bit lines 75 may include a barrier metal layer 71, a seed layer 72, and a conductive layer 73 stacked sequentially.

The upper insulating layer 67 may include silicon oxide, silicon nitride, or silicon oxynitride, for example. The barrier metal layer 71 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The conductive layer 73 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof.

In exemplary embodiments in accordance with principles of inventive concepts, the conductive buffer pattern 39 may be formed on the molding layer 29 and connected to the diode 33. Rather than forming a W plug within a diode hole, a process that increases in difficulty as feature sizes diminish, a non-volatile memory device in accordance with principles of inventive concepts may form a conductive buffer pattern atop a layer that includes the top of a diode and molding layer 29. When compared to a process of forming a W plug within a diode hole, the formation of the conductive buffer pattern 39 in accordance with principles of inventive concepts may not only drastically reduce defects, such as seam defects that might be introduced into a W plug, but may also reduce the aspect ratio of the contact hole 29H required for the diode 33, thereby improving manufacturability. Furthermore, the conductive buffer patterns 39 may be continuously formed during a patterning process for forming the electrode structures 41, also improving manufacturability. As compared with a an approach such as forming a W pad and a lower electrode separately, the formation of the conductive buffer pattern 39 in accordance with principles of inventive concepts may simplify the entire process and also prevent alignment errors. As a result, a non-volatile memory device in accordance with principles of inventive concepts may be readily manufacturable and may provide superior performance.

Embodiment 4

FIGS. 28 through 32 are cross-sectional views taken along lines I-I' and II-II' of FIG. 3, illustrating a method of fabricating a non-volatile memory device according to a fourth exemplary embodiment in accordance with principles of inventive concepts.

Figure 28:
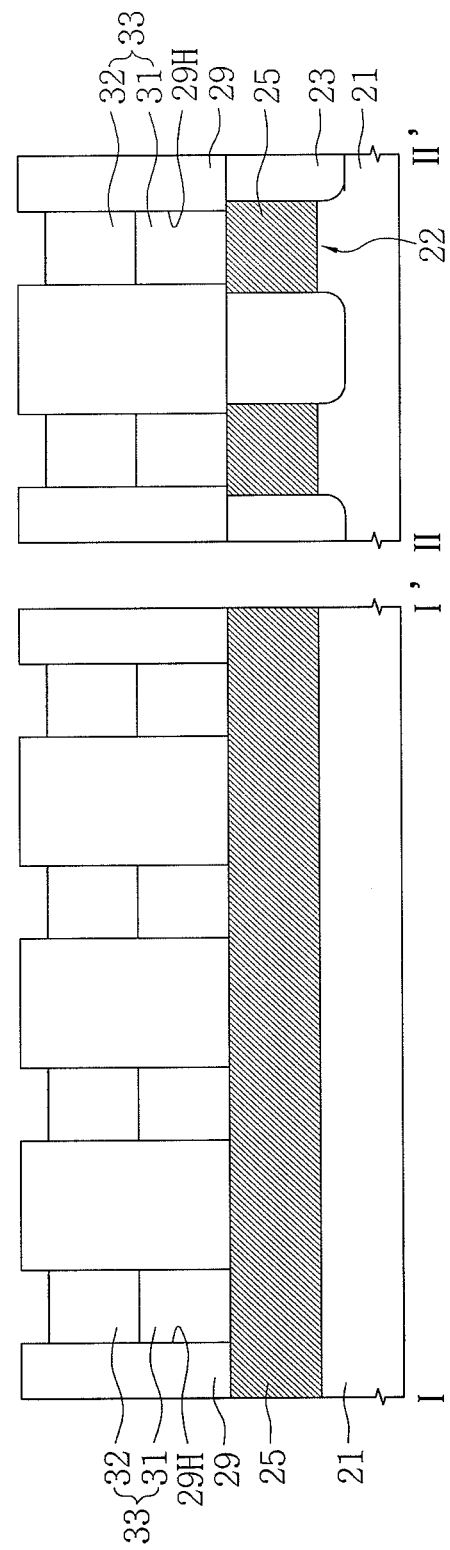
FIGS. 28 through 32 are cross-sectional views taken along lines I-I' and II-II' of FIG. 3, illustrating a method of fabricating a non-volatile memory device according to fourth embodiments of the inventive concept.

Referring to FIGS. 3 and 28, a first semiconductor pattern 31 and a second semiconductor pattern 32 may be sequentially formed within each of the contact holes 29H. The first and second semiconductor patterns 31 and 32 may constitute a diode 33. A top surface of the second semiconductor pattern 32 may be planarized using a CMP process and/or an etch-back process, for example. Subsequently, the second semiconductor pattern 32 may be etched back and recessed downward. In such a case, a top end of the second semiconductor pattern 32 may be formed lower than a top end of a molding layer 29.

Figure 29:
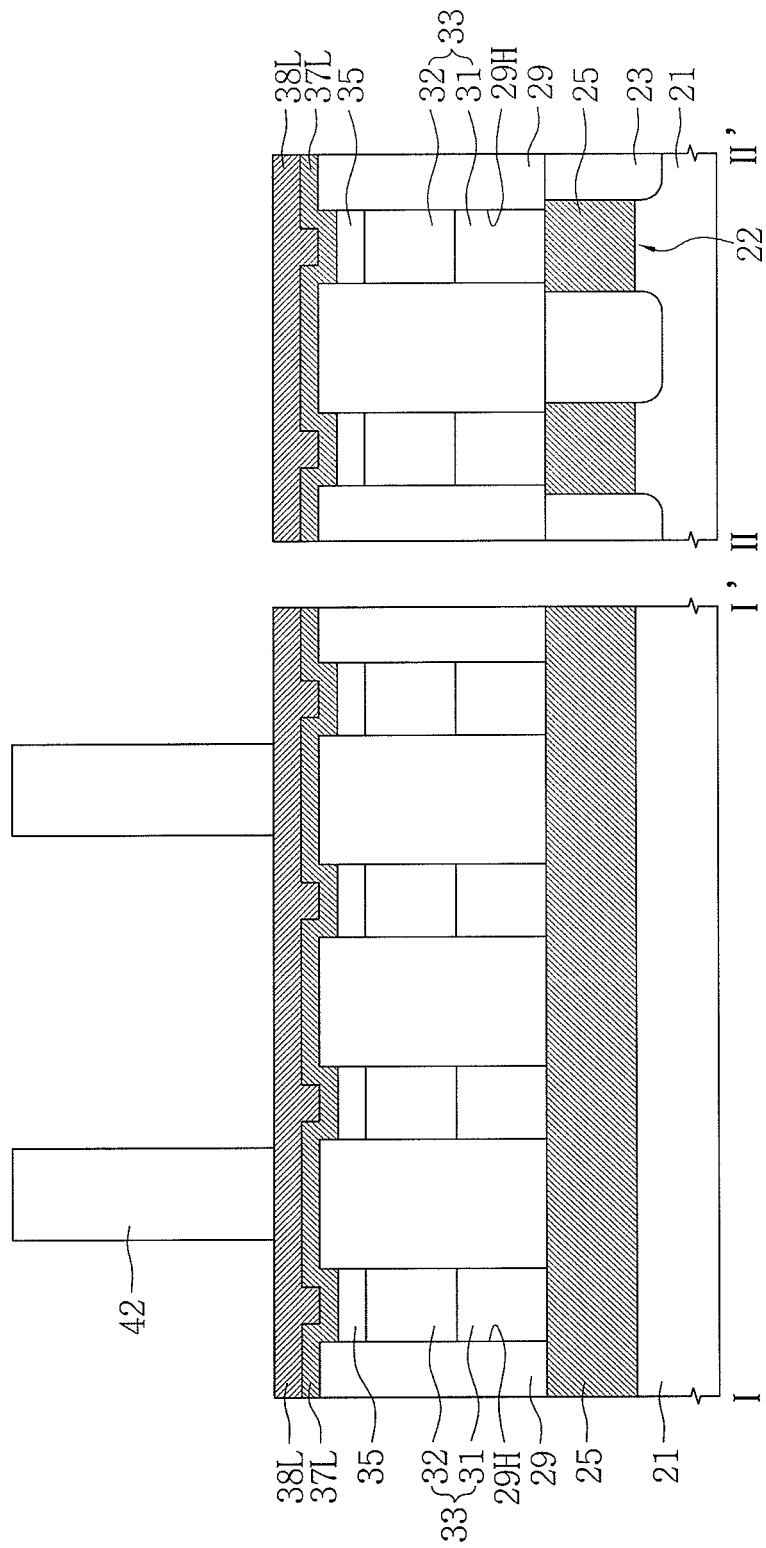

Referring to FIGS. 3 and 29, a metal silicide pattern 35 may be formed on the diode 33. The metal silicide pattern 35 may be in contact with the second semiconductor pattern 32. A top end of the metal silicide pattern 35 may be formed lower than the top end of the molding layer 29.

A first conductive layer 37L and a second conductive layer 38L may be sequentially formed on the metal silicide pattern 35 and the molding layer 29. The first conductive layer 37L may contact the metal silicide pattern 35 and cover the molding layer 29. A bottom end of the first conductive layer 37L may extend into the contact hole 29H. A bottom surface of the first conductive layer 37L may be formed lower than the top end of the molding layer 29. Sacrificial patterns 42 may be formed on the second conductive layer 38L.

Figure 30:
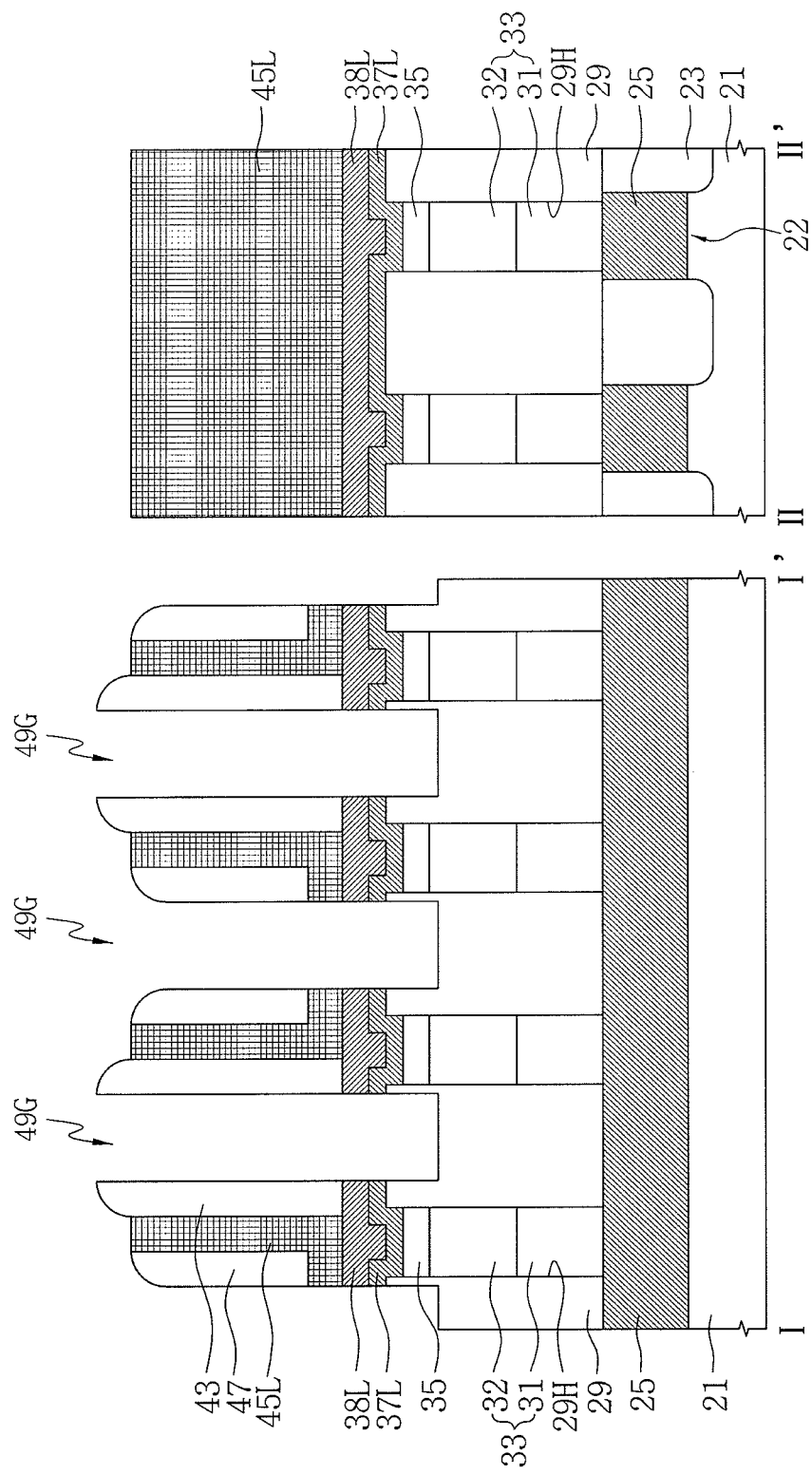

Referring to FIGS. 3 and 30, the second conductive layer 38L, the first conductive layer 37L, and the molding layer 29 may be anisotropically etched using first spacers 43, a lower electrode layer 45L, and second spacers 47 as an etch mask, thereby forming first grooves 49G.

Figure 31:
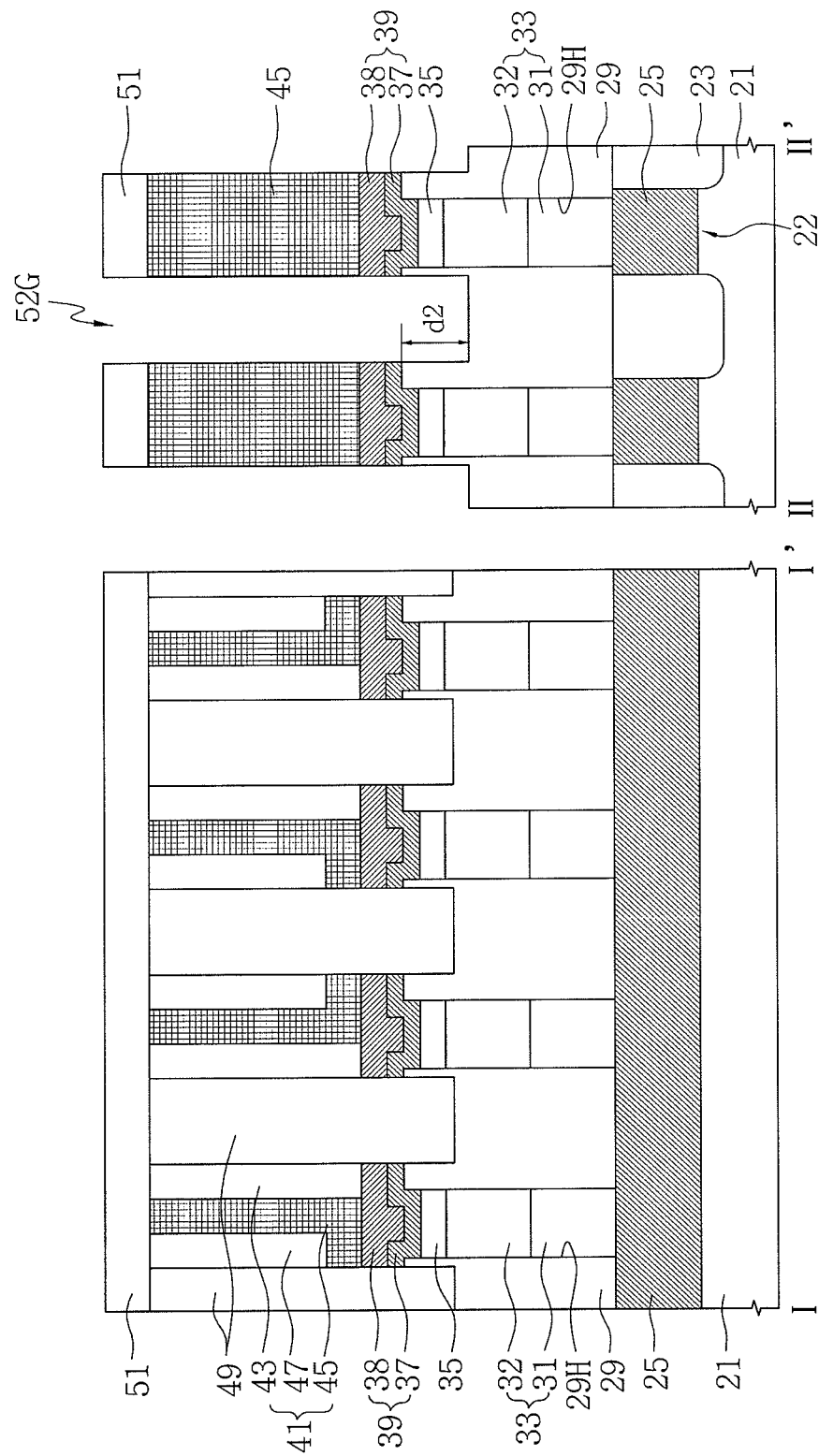

Referring to FIGS. 3 and 31, a mask pattern 51 may be formed on insulating patterns 49, the first spacers 43, the lower electrode layer 45L, and the second spacers 47. The insulating patterns 49, the first spacers 43, the lower electrode layer 45L, the second spacers 47, the second conductive layer 38L, the first conductive layer 37L, and the molding layer 29 may be anisotropically etched using the mask patterns 51 as an etch mask, thereby forming second grooves 52G and conductive buffer patterns 39.

The lower electrode layer 45L may be partially removed to form a plurality of lower electrodes 45. Each of the lower electrodes 45 may be retained between the first and second spacers 43 and 47. The lower electrode 45 and the first and second spacers 43 and 47 may constitute an electrode structure 41.

In accordance with principles of inventive concepts, each of the conductive buffer patterns 39 may include a first conductive pattern 37 and a second conductive pattern 38 stacked sequentially. The conductive buffer pattern 39 may be self-aligned with the electrode structure 41, for example. Lateral surfaces of the conductive buffer pattern 39 may be vertically aligned with lateral surfaces of the electrode structure 41. A central axis of the conductive buffer pattern 39 may deviate from a central axis of the contact hole 29H. That is, in exemplary embodiments in accordance with principle of inventive concepts, the central axis of the conductive buffer pattern 39 may deviate from a central axis of the diode 33.

Figure 32:
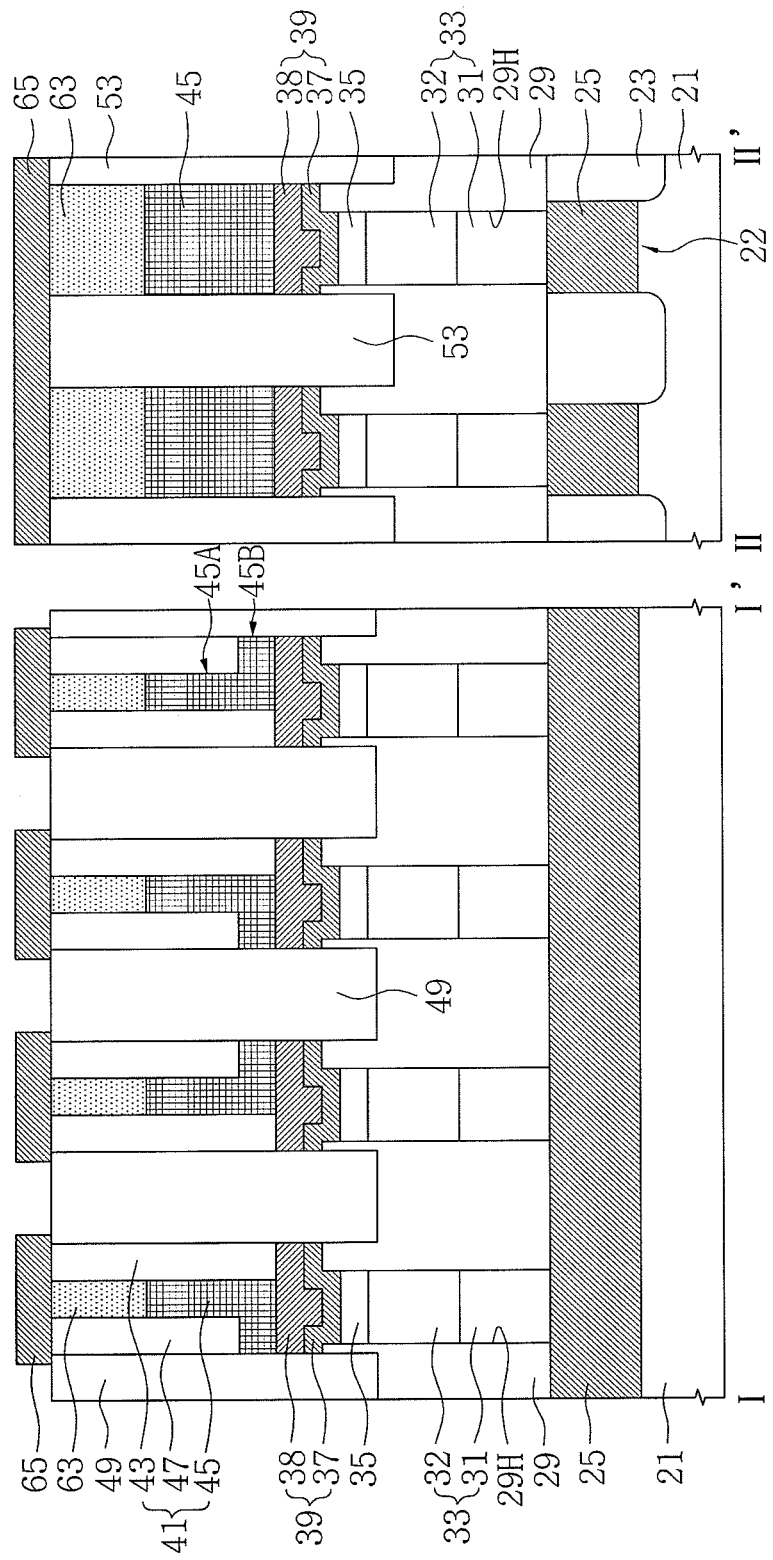

Referring to FIGS. 3 and 32, insulating lines 53 may be formed to fill the second grooves 52G. Data storage patterns 63 may be formed between the first spacers 43 and the second spacers 47. Upper electrodes 65 may be formed on the data storage patterns 63.

Referring to FIGS. 3 and 7, an upper insulating layer 67 may be formed to cover the upper electrodes 65. Bit lines 75 may be formed to penetrate the upper insulating layer 67 and contact the upper electrodes 65. Each of the bit lines 75 may include a barrier metal layer 71, a seed layer 72, and a conductive layer 73 stacked sequentially.

Figure 33:
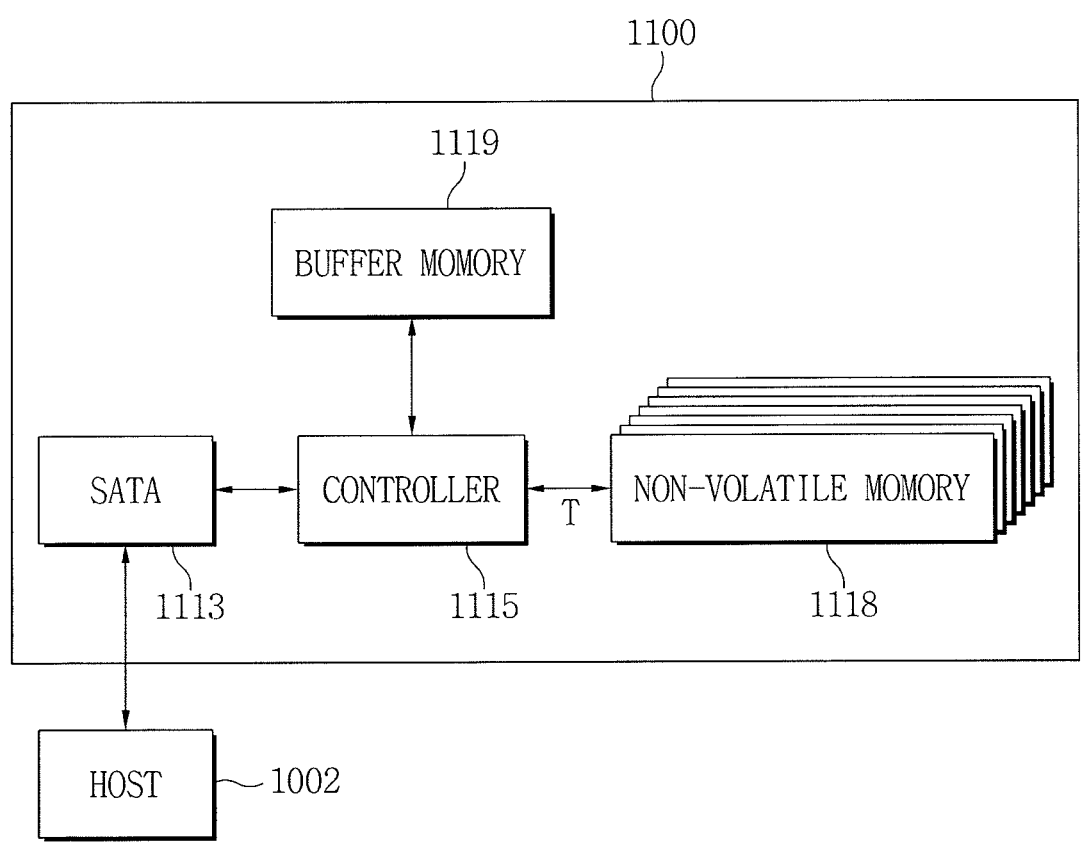
FIG. 33 is a block diagram of an electronic system according to fifth embodiments of the inventive concept.

FIG. 33 is a block diagram of an electronic system that may employ a non-volatile memory in accordance with principles of inventive concepts. The electronic system may be, or may include, a data storage device, such as a solid-state disk (SSD) 1100, for example.

Referring to FIG. 33, the SSD 1100 may include an interface 1113, a controller 1115, a non-volatile memory 1118, and a buffer memory 1119.

The SSD 1100 may be a device configured to store information using a semiconductor device such as a non-volatile memory in accordance with principles of inventive concepts. As compared with a hard disk drive (HDD), the SSD 1100 may operate with higher access speed, reduced mechanical delay, reduced failure rate, reduced heat generation, and lower noise, and may be more compact and lighter-weight. The SSD 1100 may be widely used for laptop personal computers (laptop PCs), desktop PCs, MP3 players, or portable storage devices, for example.

The controller 1115 may be formed adjacent to and electrically connected to the interface 1113. The controller 1115 may be a microprocessor (MP), including a memory controller and a buffer controller. The non-volatile memory 1118 may be formed adjacent to and electrically connected to the controller 1115. The SSD 1100 may have a rated data capacity corresponding to the capacity of non-volatile memory 1118. The buffer memory 1119 may be formed adjacent to and electrically connected to the controller 1115.

The interface 1113 may be connected to a host 1002 and may serve to transmit and receive electric signals, such as data. For example, the interface 1113 may be an apparatus using a standard, such as serial advanced technology attachment (SATA), integrated drive electronics (IDE), small computer system interface (SCSI), and/or a combination thereof, for example. The non-volatile memory 1118 may be connected to the interface 1113 through the controller 1115. The non-volatile memory 1118 may function to store data received through the interface 1113.

The buffer memory 1119 may include a volatile memory device such as a dynamic random access memory (DRAM) and/or a static random access memory (SRAM), for example. The buffer memory 1119 may operate at higher speed than the non-volatile memory device 1118.

Data processing speed of the interface 1113 may be higher than operation speed of the non-volatile memory device 1118. In such a case, the buffer memory 1119 may function to temporarily store data. After data received through the interface 1113 is temporarily stored in the buffer memory 1119 through the controller 1115, the received data may be permanently stored in the non-volatile memory 1118 at a data write speed of the non-volatile memory 1118. Additionally, among data stored in the non-volatile memory 1118, frequently used data may be previously read and temporarily stored in the buffer memory 1119. That is, the buffer memory 1119 may function to increase effective operating speed of the SSD 1100 and reduce error rate.

The non-volatile memory 1118 may include a non-volatile memory device in accordance with principles of inventive concepts, such as described in the discussion related to previous figures herein. For example, the non-volatile memory device 1118 may include memory cells, of substantially the same configuration as shown in FIG. 1. In this case, the non-volatile memory 1118 may exhibit superior electrical properties, due, at least in part, to the configurations of the diodes 33, the conductive buffer patterns 39, and the electrode structures 41, for example. Thus, performance of an SSD 1100 employing a non-volatile memory device in accordance with principles of inventive concepts may be markedly better than an SSD not employing a non-volatile memory device in accordance with principles of inventive concepts.

Figure 34:
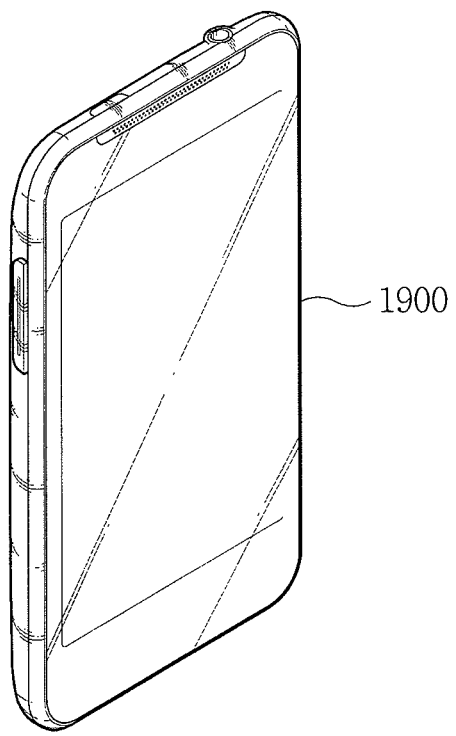
FIGS. 34 and 35 are respectively a perspective view and block diagram of an electronic system according to sixth embodiments of the inventive concept.
Figure 35:
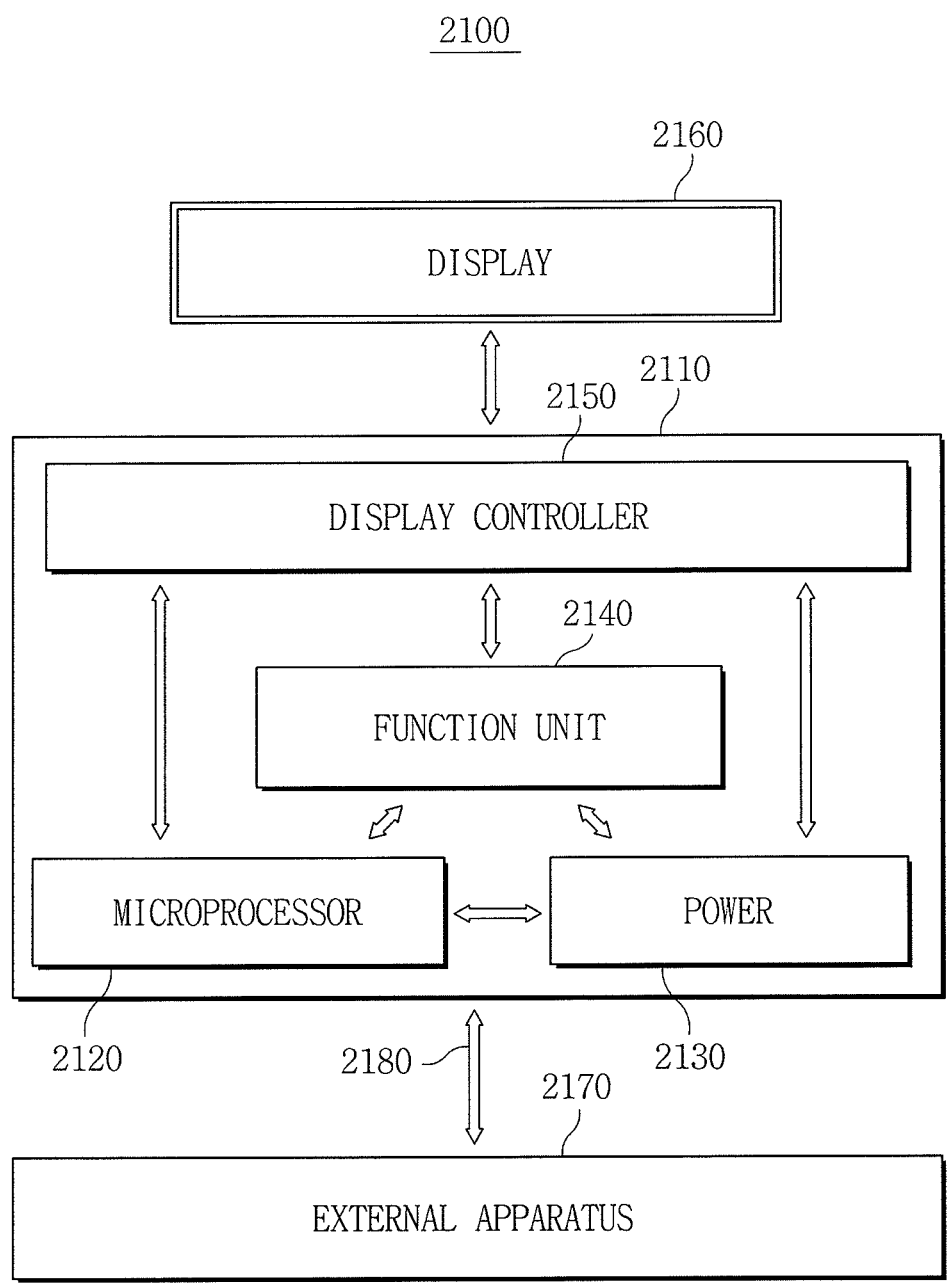

FIGS. 34 and 35 are respectively a perspective view and block diagram of an electronic system such as may employ a non-volatile memory device in accordance with principles of inventive concepts.

Referring to FIG. 34, a non-volatile memory device in accordance with principles of inventive concepts may be effectively applied to electronic systems, such as a portable phone 1900, a netbook, a laptop computer, or a tablet PC. For example, a non-volatile memory device in accordance with principles of inventive concepts may be mounted on a main board of the portable phone 1900. Furthermore, such a non-volatile memory device may be provided to an expansion device, such as an external memory card, and combined with the portable phone 1900.

Referring to FIG. 35, such a non-volatile memory device may be applied to, or employed by, an electronic system 2100. The electronic system 2100 may include a body 2110, an MP unit 2120, a power unit 2130, a function unit 2140, and a display controller unit 2150. The body 2110 may include a mother board including a printed circuit board (PCB). The MP unit 2120, the power unit 2130, the function unit 2140, and the display controller unit 2150 may be mounted on the body 2110. The display unit 2160 may be disposed inside or outside the body 2110. For example, the display unit 2160 may be disposed on the surface of the body 2110 and display an image processed by the display controller unit 2150.

The power unit 2130 may function to receive a predetermined voltage from an external battery (not shown), divide the voltage into required voltage levels, and supply the divided voltages to the MP unit 2120, the function unit 2140, and the display controller unit 2150. The MP unit 2120 may receive a voltage from the power unit 2130 and control the function unit 2140 and the display unit 2160. The function unit 2140 may serve various functions of the electronic system 2100. For example, when the electronic system 2100 is a portable phone, the function unit 2140 may include several components capable of serving various functions of the portable phone, for example, outputting an image to the display unit 2160 or outputting a voice to a speaker, by dialing or communicating with an external apparatus 2170. When a camera is also mounted, the function unit 2140 may serve as a camera image processor, for example.

In exemplary embodiments in accordance with principles of inventive concepts, when the electronic system 2100 is connected to a memory card to increase capacity, the function unit 2140 may be a memory card controller. The function unit 2140 may transmit/receive signals to/from the external apparatus 2170 through a wired or wireless communication unit 2180. Furthermore, when the electronic system 2100 requires a universal serial bus (USB) to increase functionality, the function unit 2140 may serve as an interface controller. In addition, the function unit 2140 may include a mass storage device.

A non-volatile memory device in accordance with principles of inventive concepts may be applied to the function unit 2140. For example, the function unit 2140 may include the substrate 21, the diodes 33, the conductive buffer patterns 39, the lower electrodes 41, the data storage plugs 63, and the upper electrodes 65. The data storage plugs 63 may be electrically connected to the body 2110. In such a case, the electronic system 2100 may exhibit better performance than a system that does not include non-volatile memory in accordance with principles of inventive concepts, due, at least in part, to the configurations of the diodes 33, the conductive buffer pattern 39, and the electrode structures 41.

According to exemplary embodiments in accordance with principles of inventive concepts, a conductive buffer pattern vertically aligned with a lower portion of an electrode structure may be provided. The conductive buffer pattern may be electrically connected to a diode. The conductive buffer pattern may have a different shape from the diode. A non-volatile memory device in accordance with principles of inventive concepts that employs such a conductive buffer pattern may exhibit improved ohmic contact between a lower electrode and a switching device, such as a diode, resulting in improved performance, compared to devices without such a conductive buffer pattern.

The foregoing is illustrative of embodiments and is not to be construed as limiting thereof. Although exemplary embodiments have been described, those skilled in the art will readily appreciate that many modifications are possible without materially departing from the teachings and advantages of inventive concepts. Accordingly, all such modifications are intended to be included within the scope of inventive concepts as defined in the claims. In the claims, means-plus-function clauses are intended to cover the structures described herein as performing the recited function, and not only structural equivalents but also equivalent structures.

What is claimed is:

1. A non-volatile memory device, comprising:
a vertical diode on a substrate;
a conductive buffer pattern on the diode, the surface of the conductive buffer pattern in contact with the diode having a greater area than the surface of the diode in contact with the conductive buffer pattern;
an electrode structure on the conductive buffer pattern; and
a data storage pattern on the electrode structure,
wherein one lateral surface of the conductive buffer pattern is vertically aligned with one lateral surface of the electrode structure, the diode has a cylindrical shape, and the conductive buffer pattern has a hexahedral shape.

2. The device of claim 1, further comprising a molding layer on the substrate,
wherein the diode is formed within a contact hole configured to penetrate the molding layer, and the conductive buffer pattern is on the molding layer.

3. The device of claim 2, wherein a bottom end of the conductive buffer pattern extends into the contact hole.

4. The device of claim 1, wherein the electrode structure comprises:
a lower electrode;
a first spacer on a first lateral surface of the lower electrode; and
a second spacer on a second lateral surface of the lower electrode facing the first lateral surface of the lower electrode.

5. The device of claim 4, wherein the lower electrode comprises:
an upper part having a vertical height greater than a horizontal width; and
a lower part having a horizontal width greater than a vertical height,
wherein the first lateral surface of the lower electrode includes a first lateral surface of the upper part, and a first lateral surface of the lower part,
an inner lateral surface of the first spacer contacts the first lateral surface of the lower part and the first lateral surface of the upper part, and an inner lateral surface of the second spacer contacts a top surface of the lower part and a second lateral surface of the upper part facing the lateral surface of the upper part.

6. The device of claim 5, wherein a first lateral surface of the conductive buffer pattern is vertically aligned with an outer lateral surface of the second spacer and a second lateral surface of the lower part facing the first lateral surface of the lower part,
a second lateral surface of the conductive buffer pattern facing the first lateral surface of the conductive buffer pattern is vertically aligned with an outer lateral surface of the first spacer.

7. The device of claim 5, wherein the data storage pattern is interposed between the first spacer and the second spacer,
lateral surfaces of the data storage pattern are vertically aligned with the first and second lateral surfaces of the upper part of the lower electrode.

8. The device of claim 1, further comprising:
a metal silicide pattern interposed between the diode and the conductive buffer pattern; and
an upper electrode on the data storage pattern.

9. The device of claim 1, wherein one lateral surface of the conductive buffer pattern is coplanar with one lateral surface of the electrode structure.

* * * * *